(12) United States Patent  (10) Patent No.: US 8,081,508 B2
Kim et al.  (45) Date of Patent: Dec. 20, 2011

(54) FLASH MEMORY DEVICE AND MEMORY SYSTEM INCLUDING THE SAME

(75) Inventors: Moosung Kim, Gyeonggi-do (KR); Sungsoo Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 139 days.

(21) Appl. No.: 12/577,876

(22) Filed: Oct. 13, 2009

(65) Prior Publication Data

US 2010/0110793 A1 May 6, 2010

(30) Foreign Application Priority Data

Nov. 3, 2008 (KR) ................................ 2008-108387

(51) Int. Cl.
*G11C 11/34* (2006.01)

(52) U.S. Cl. ......... 365/185.03; 365/185.17; 365/185.18; 365/185.22; 365/185.24; 365/185.33

(58) Field of Classification Search .............. 365/185.03, 365/185.17, 185.18, 185.22, 185.24, 185.33
See application file for complete search history.

(56) References Cited

U.S. PATENT DOCUMENTS

| | | | |
|---|---|---|---|
| 6,870,766 B2 | 3/2005 | Cho et al. | |
| 7,009,881 B2 * | 3/2006 | Noguchi | 365/185.03 |
| 7,342,831 B2 * | 3/2008 | Mokhlesi et al. | 365/185.22 |
| 7,463,528 B2 * | 12/2008 | Mokhlesi et al. | 365/185.22 |
| 7,542,350 B2 * | 6/2009 | Park et al. | 365/185.33 |
| 7,561,472 B2 * | 7/2009 | Doyle | 365/185.03 |
| 7,583,535 B2 * | 9/2009 | Sekar et al. | 365/185.18 |
| 7,583,539 B2 * | 9/2009 | Sekar et al. | 365/185.18 |
| 7,616,490 B2 * | 11/2009 | Mokhlesi et al. | 365/185.17 |
| 7,719,888 B2 * | 5/2010 | Han | 365/185.17 |
| 7,751,244 B2 * | 7/2010 | Sekar et al. | 365/185.17 |
| 7,755,946 B2 * | 7/2010 | Dunga et al. | 365/185.17 |
| 7,808,819 B2 * | 10/2010 | Murin et al. | 365/185.03 |
| 7,876,618 B2 * | 1/2011 | Lee et al. | 365/185.18 |
| 7,876,620 B2 * | 1/2011 | Mokhlesi et al. | 365/185.18 |
| 7,916,533 B2 * | 3/2011 | Dong et al. | 365/185.24 |
| 2007/0183207 A1 | 8/2007 | Park | |

FOREIGN PATENT DOCUMENTS

| | | |
|---|---|---|
| JP | 2002-367382 | 12/2002 |
| JP | 2003-303496 | 10/2003 |
| KR | 1020030079425 A | 10/2003 |
| KR | 1020070080037 A | 8/2007 |

\* cited by examiner

*Primary Examiner* — Trong Phan
(74) *Attorney, Agent, or Firm* — Myers Bigel Sibley & Sajovec, P.A.

(57) ABSTRACT

Provided is a flash memory device. The flash memory device includes a memory cell array, and a voltage generator. The memory cell array is connected to a plurality of word lines. The voltage generator generates a program voltage which is supplied to a selected word line of the word lines and a pass voltage which is supplied to a non-selected word line of the word lines, in a program operation. The voltage generator varies a level of the pass voltage with a temperature.

10 Claims, 15 Drawing Sheets

FLASH MEMORY DEVICE AND MEMORY SYSTEM INCLUDING THE SAME

REFERENCE TO PRIORITY APPLICATION

This application claims priority to Korean Patent Application No. 10-2008-0108387, filed Nov. 3, 2008, the contents of which are hereby incorporated herein by reference.

FIELD OF THE INVENTION

The present invention disclosed herein relates to a semiconductor memory device, and more particularly, to a flash memory device.

BACKGROUND

A semiconductor memory device is a memory device that stores data and enables the stored data to be read when necessary. Semiconductor memory devices can largely be divided into a volatile memory device and a nonvolatile memory device.

The volatile memory device is one in which stored data are erased when a power supply source is shut off. Volatile memory devices include static random access memory (SRAM), dynamic random access memory (DRAM) and synchronous dynamic random access memory (SDRAM). The nonvolatile memory device is one in which stored data are not erased even when a power supply source is shut off. Nonvolatile memory devices include Read Only Memory (ROM), Programmable Read Only Memory (PROM), Erasable Programmable Read Only Memory (EPROM), Electrical Erasable Programmable Read Only Memory (EEPROM), flash memory devices, Phase-change Random Access Memory (PRAM), Magnetoresistive Random Access Memory (MRAM), Resistive Random Access Memory (RRAM) and Ferroelectric Random Access Memory (FRAM). Flash memory devices can largely be classified into NOR type and NAND type devices. The NAND flash memory device provides a higher degree of integration than the NOR flash memory device, while the NOR flash memory device provides a higher operating speed than the NAND flash memory device.

SUMMARY

The present invention provides a flash memory device, which normally operates in spite of the change of a peripheral temperature.

Embodiments of the present invention provide a flash memory device, including: a memory cell array connected to a plurality of word lines; and a voltage generator generating a program voltage which is supplied to a selected word line of the word lines and a pass voltage which is supplied to a non-selected word line of the word lines, in a program operation, wherein the voltage generator varies a level of the pass voltage with a temperature.

In some embodiments, the pass voltage may be divided into different first and second pass voltages according to a location of the non-selected word line. The flash memory device may further include a control logic controlling timing, in which the first and second pass voltages and the program voltage are applied to the memory cell array, with the temperature in the program operation. The second pass voltage may be higher than a ground voltage and lower than the first pass voltage.

In still other embodiments, the flash memory device may further include a word line controller receiving the first and second pass voltages and the program voltage from the voltage generator, wherein the word line controller may select any one of the first and second pass voltages and the program voltage to apply the selected voltage to a corresponding word line and may control timing in which the selected voltage is applied, in response to a row address, the temperature and a program interval signal which is transferred from the control logic.

In even other embodiments, the voltage generator may include: a temperature detection circuit detecting the temperature; a voltage control circuit converting the detected temperature into a control signal for varying the pass voltage; and a voltage generation circuit varying the level of the pass voltage in response to the control signal.

In yet other embodiments, the voltage generator may generate a selection read voltage which is applied to the selected word line in a read operation, a read voltage which is applied to the non-selected word line in the read operation and a verification voltage which is applied in the program operation, and may vary a level of the selection read voltage, a level of the read voltage and a level of the verification voltage with the temperature.

In further embodiments, when the temperature is higher than a temperature of a previous state, the voltage generator may further decrease the level of the pass voltage than a level of the previous state.

In still further embodiments, when the temperature is lower than a temperature of a previous state, the voltage generator may further increase the level of the pass voltage than a level of the previous state.

In other embodiments of the present invention, a memory system, including: a flash memory device; and a controller controlling the flash memory device, wherein the flash memory device includes: a memory cell array connected to a plurality of word lines; and a voltage generator generating a program voltage which is supplied to a selected word line of the word lines and a pass voltage which is supplied to a non-selected word line of the word lines, in a program operation, wherein the voltage generator varies a level of the pass voltage with a temperature.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

A flash memory device according to embodiments of the present invention includes a memory cell array that is connected to a plurality of word lines, and a voltage generator that generates a program voltage and a pass voltage which are respectively provided to the selected word line and non-selected word line of the word lines when a program operates, wherein the voltage generator varies the level of the pass voltage with temperature. Accordingly, the flash memory device is provided which operates with change of a peripheral temperature.

Figure 1:
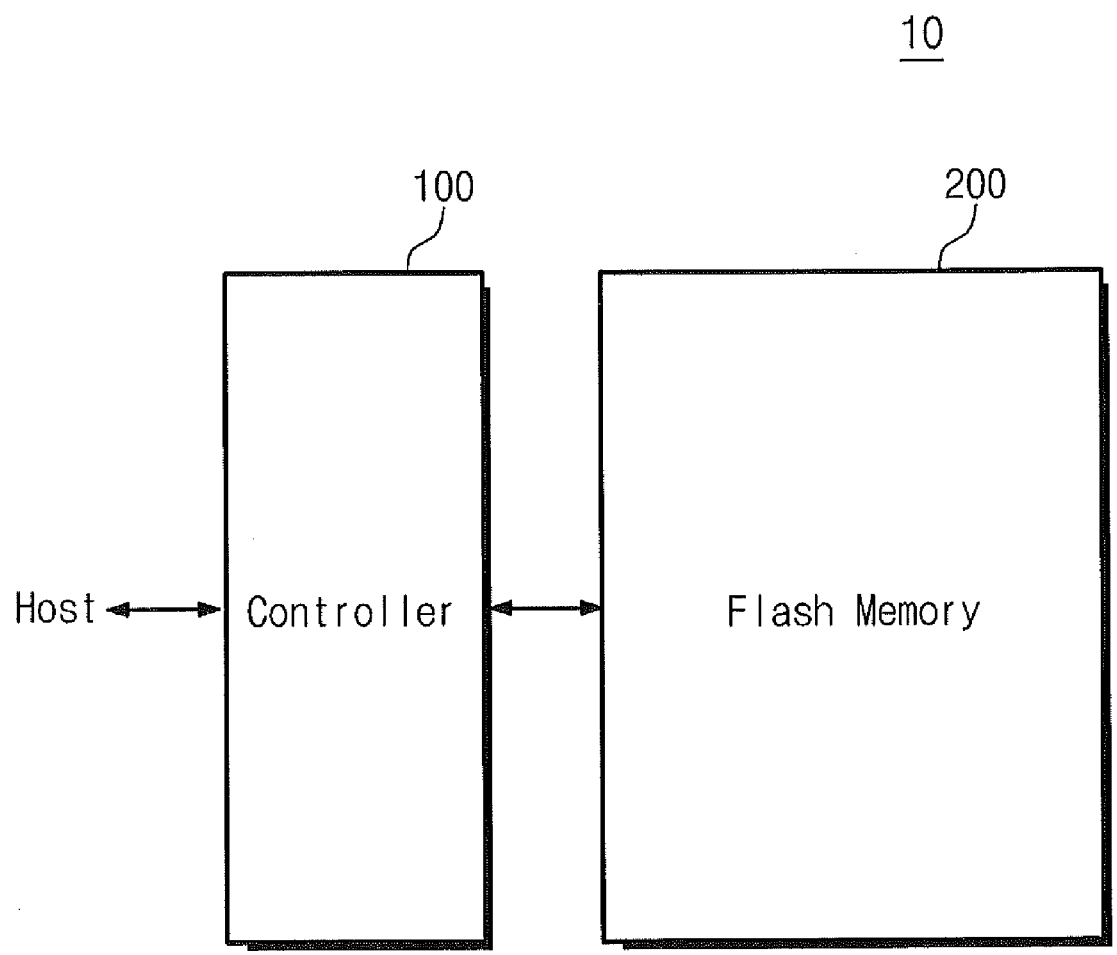
FIG. 1 is a block diagram illustrating a memory system according to an embodiment of the present invention.

FIG. 1 is a block diagram illustrating a memory system 10 according to an embodiment of the present invention.

Referring to FIG. 1, a memory system 10 according to an embodiment of the present invention includes a flash memory device 200 and a controller 100.

The controller 100 is connected to a host and a flash memory device 200. The controller 100 transfers data, which are read from the flash memory device 200, to the host, and stores data, which are transferred from the host, in the flash memory device 200.

The controller 100 may include well-known elements such as RAM, processing unit, host interface and memory interface. The RAM may be used as the operation memory of the processing unit. The processing unit may control the overall operation of the controller 100. The host interface may include a protocol for exchanging data between the host and the controller 100. For example, the controller 100 may communicate with external devices (for example, the host) according to any one of various interface protocols such as USB, MMC, PCI-E, Advanced Technology Attachment (ATA). Serial-ATA, Parallel-ATA, SCSI, ESDI and Integrated Drive Electronics (IDE). The memory interface may interface with the flash memory device 200. The controller 100 may further include an error correction block. The error correction block may detect and correct data that are read from the flash memory device 200.

The flash memory device 200 may include a memory cell array for storing data, a read/write circuit for writing/reading data in/from the memory cell array, a row decoder for selecting at least one word line in response to a row address, and a control logic for controlling the overall operation of the flash memory device 200. The flash memory device 200 will be described in more detail with reference to FIG. 2.

The controller 100 and the flash memory device 200 may be integrated in one semiconductor device. As an example, the controller 100 and the flash memory device 200 are integrated in one semiconductor device and may thereby configure a memory card. The controller 100 and the flash memory device 200, for example, are integrated in one semiconductor device and may thereby configure PC card (PCMCIA), compact flash card (CF), smart media card (SM/SMC), memory stick, multimedia card (for example, MMC, RS-MMC and MMC micro), SD card (for example, SD, mini SD and micro SD) and Universal Flash Storage (UFS).

As another example, the controller 100 and the flash memory device 200 are integrated in one semiconductor device and may thereby configure a Solid State Disk/Drive (SSD). When the memory system 10 is used as the SSD, the operation speed of the host that is connected to the memory system can be greatly improved.

As another example, the memory system 10 may be applied to Personal Digital Assistant (PDA), portable computer, web tablet, wireless phone, mobile phone, digital music player, or devices that may transmit/receive information in a wireless environment.

As another example, the flash memory device 200 or the memory system 10 may be mounted as various types of packages. For example, the flash memory device 200 or the memory system 10 may be packaged and mounted in a package type such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

Figure 2:
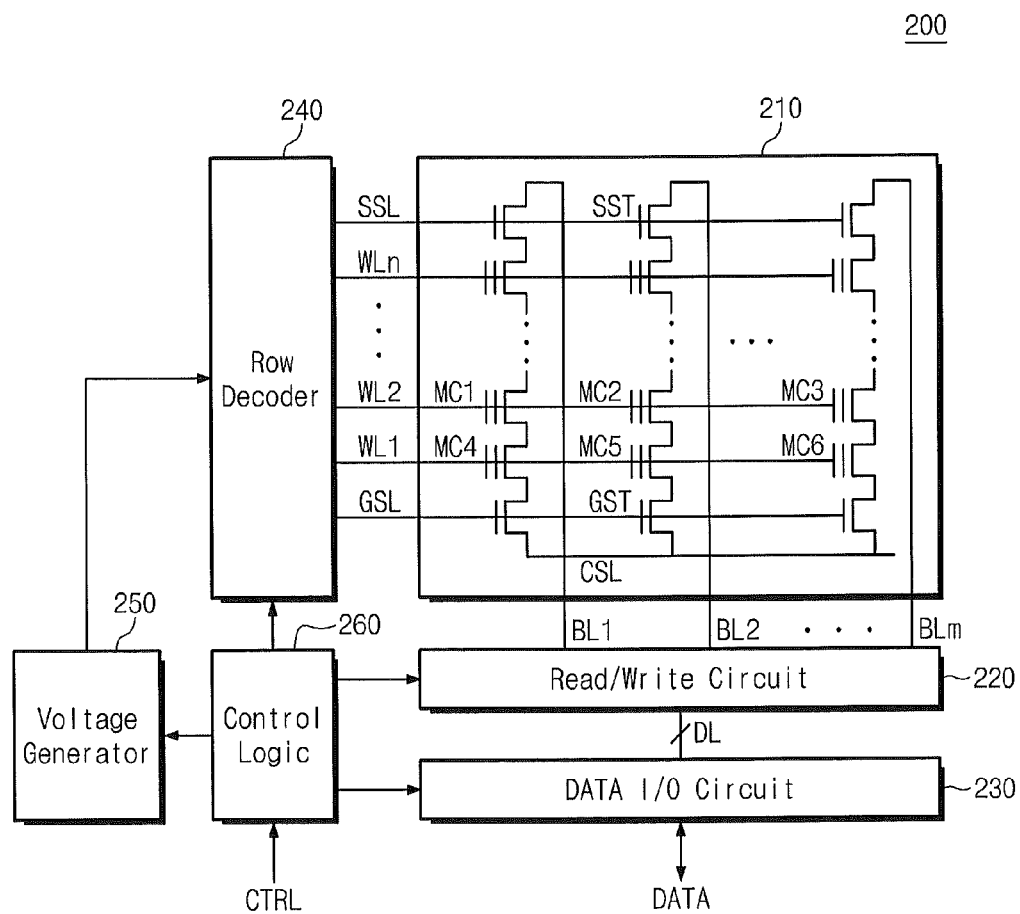
FIG. 2 is a block diagram illustrating a flash memory device in FIG. 1.

FIG. 2 is a block diagram illustrating the flash memory device 200 in FIG. 1.

Referring to FIG. 2, the flash memory device 200 according to an embodiment of the present invention includes a memory cell array 210, a read/write circuit 220, a data I/O circuit 230, a row decoder 240, a voltage generator 250, and a control logic 260.

The memory cell array 210 is connected to the read/write circuit 220 through bit lines BL1 to BLm. The memory cell array 210 is connected to the row decoder 240 through word lines WL1 to WLn, a string selection line SSL and a ground selection line GSL. The memory cell array 210 stores data that are transferred from the read/write circuit 220.

The memory cell array 210 includes a plurality of memory cells MC. The serially-connected memory cells MC configure a memory cell string. The memory cell array 210 includes a plurality of memory cell strings. The memory cells MC of the identical row of the memory cell strings are connected to corresponding word lines among the word lines WL1 to WLn. String selection transistors SST are connected between the memory cell strings and the bit lines BL1 to BLm. The string selection transistors SST are connected to the string selection line SSL. Ground selection transistors GST are connected between the memory cell strings and a common source line CSL. The ground selection transistors GST are connected to the ground selection line GSL.

The read/write circuit 220 is connected to the memory cell array 210 through the bit lines BL1 to BLm, and is connected to the data I/O circuit 230 through a data line DL. The read/write circuit 220 selects the bit lines BL1 to BLm in response to a column address. The read/write circuit 220 operates according to the control of the control logic 260. The read/write circuit 220 writes data, which are transferred through the data line DL from the data I/O circuit 230, in the memory cell array 210. The read/write circuit 230 transfers data, which are read from the memory cell array 210, to the data I/O circuit 230 through the data line DL. The read/write circuit 220 writes (i.e., copy-back operate) data, which are read from the memory cell array 210, in the memory cell array 210. The read/write circuit 220 selects the bit lines BL1 to BLm in response to the column address. As an example, the read/write circuit 220 may include well-known elements such as a row selection circuit and a page buffer.

The data I/O circuit 230 is connected to the read/write circuit 220 through the data line DL. The data I/O circuit 230 operates according to the control of the control logic 260. The data I/O circuit 230 exchanges a data DATA with external devices. As an example, the data I/O circuit 230 exchanges the data DATA with the controller 100 in FIG. 1. The data I/O circuit 230 transfers the data DATA, which is transferred from the outside, to the read/write circuit 220 through the data line DL. The data I/O circuit 230 transfers the data DATA, which is transferred through the data line DL from the read/write circuit 220, to the outside. For example, the data I/O circuit 230 may include well-known elements such as a data buffer.

The row decoder 240 is connected to the memory cell array 210 through the word lines WL1 to WLn, the string selection line SSL and the ground selection line GSL. The row decoder 240 selects the word lines WL1 to WLn in response to a row address. The row decoder 240 receives a voltage from the voltage generator 250 and applies the received voltage to the word lines WL1 to WLn. The row decoder 240 operates according to the control of the control logic 260.

The voltage generator 250 operates according to the control of the control logic 260. The voltage generator 250 generates voltages that are required in the flash memory device 200. As an example, the voltage generator 250 may include a device that converts an external power supply source into an internal power supply source, and a device that boosts an internal power supply source or an external power supply source to generate a high voltage.

The control logic 260 is connected to the read/write circuit 220, the data I/O circuit 230, the row decoder 240, and the voltage generator 250. The control logic 260 controls the overall operation of the flash memory device 200, in response to a control signal CTRL.

Figure 3:
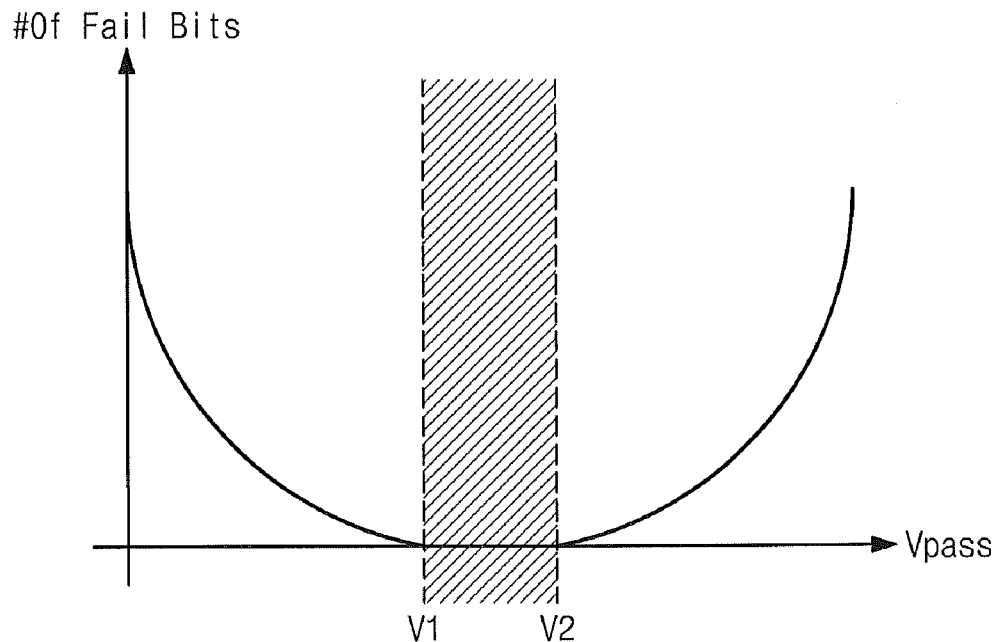
FIG. 3 is a diagram illustrating the pass voltage window of the flash memory device in FIG. 2.

FIG. 3 is a diagram illustrating the pass voltage window of the flash memory device 200 in FIG. 2. In FIG. 3, the abscissa axis represents the level of a pass voltage Vpass, and the ordinate axis represents the number of bits that are failed when a program operates. Hereinafter, the program operation of the flash memory device 200 will be described with reference to FIGS. 2 and 3.

Assuming that a program operation on a memory cell MC5 is performed, a bit line BL2 may be set up to a ground voltage Vss, and other bit lines BL2 to BLm may be set up to a power supply source voltage Vcc. A voltage lower than the threshold voltage of the ground selection transistor GST may be applied to the ground selection line SGL, and the power supply source voltage Vcc may be applied to the string selection line SSL. When the pass voltage Vpass is applied to the word lines WL1 to WLn, the channel voltages of the memory cells MC2 and MC5 maintain the power supply source voltage Vcc, and the channel voltages of the memory cells MC1, MC3, MC4 and MC6 are boosted and may thereby be higher than the power supply source voltage Vcc. Afterwards, when a program voltage Vpgm is applied to the word line WL1, the memory cell MC5 may be programmed. Because the channel voltages of the memory cells MC4 and MC6 increase by boost, the memory cells MC4 and MC6 may not be programmed by the program voltage Vpgm.

Upon the above-described program operation, program disturbance may be caused by the program voltage Vpgm, and program disturbance may be caused by the pass voltage Vpass. First, the program disturbance by the program voltage Vpgm will be described. In order for the memory cells MC4 and MC6 not to be programmed by the program voltage Vpgm, the channel voltages of the memory cells MC4 and MC6 are boosted to a predetermined voltage level by the pass voltage Vpass. If the channel voltages of the memory cells MC4 and MC6 are not boosted by the degree in which the programs of the memory cells MC4 and MC6 are prohibited, i.e., if the level of the pass voltage Vpass is not high by the degree in which the channel voltages of the memory cells MC4 and MC6 are sufficiently boosted, the memory cells MC4 and MC6 may be programmed by the program voltage Vpgm. In other words, when the level of the pass voltage Vpass is lower than a predetermined level, program disturbance may be caused by the program voltage Vpgm.

In FIG. 3, if the level of the pass voltage Vpass is lower than a voltage V1, the number of bits that are failed increases when a program operates. That is, the voltage V1 represents the lowest level of the pass voltage Vpass for boosting the channel voltages of the memory cells MC4 and MC6 by the degree in which the programs of the memory cells MC4 and MC6 are prohibited. When the level of the pass voltage Vpass is higher than the voltage V1, program disturbance may not be caused by the program voltage Vpgm.

Next, program disturbance by the pass voltage Vpass will be described below. The channel voltage of the memory cell MC2 maintains the ground voltage Vss. The pass voltage Vpass is applied to the control gate of the memory cell MC2. When the level of the pass voltage Vpass is high by the degree in which F-N tunneling may occur in the memory cell MC2, the memory cell MC2 may be programmed. That is, program disturbance may be caused by the pass voltage Vpass.

In FIG. 3, if the voltage V2 is higher than the level of the pass voltage Vpass, the number of bits that are failed increases when a program operates. That is, the voltage V2 represents the highest level of the pass voltage Vpass for allowing the memory cell MC2 not to be programmed.

To provide a brief description, if the level of the pass voltage Vpass is higher than the voltage V1 and is lower than the voltage V2, a fail bit does not occur because program disturbance may not be caused by the program voltage Vpgm and the pass voltage Vpass when a program operates. A pass voltage window represents the range V1 to V2 of the pass voltage Vpass in which a fail bit does not occur by program disturbance when a program operates.

The pass voltage window may vary with a peripheral temperature. As an example, it is assumed that the pass voltage window V1 to V2 in FIG. 3 represents the range of the pass voltage Vpass in which a fail bit does not occur at an ordinary temperature (Te1, for example, 20° C.).

Figure 4:
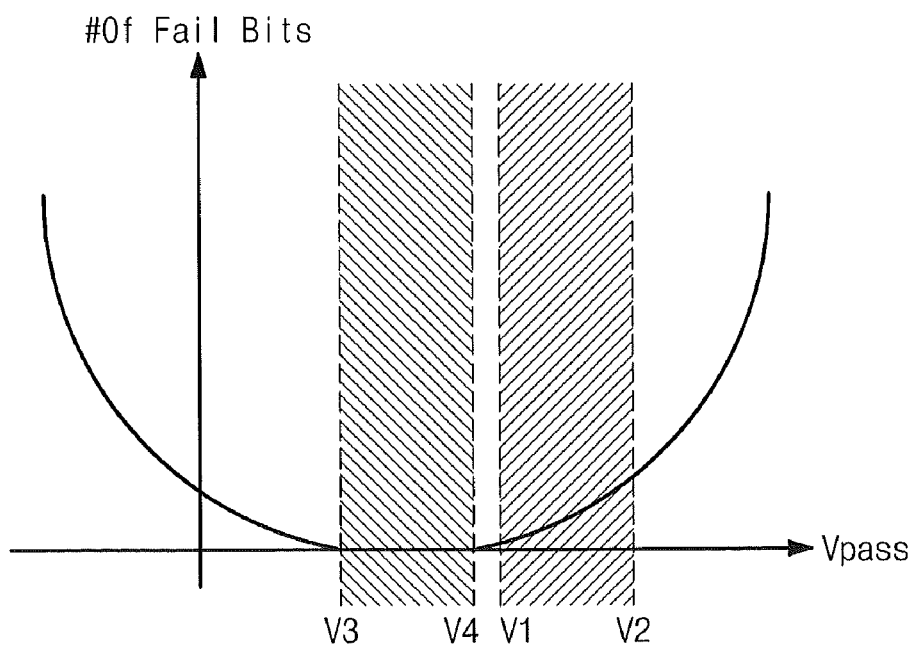
FIG. 4 is a diagram illustrating a pass voltage window at a higher temperature than a pass voltage window in FIG. 3.

FIG. 4 is a diagram illustrating a pass voltage window at a higher temperature (Te2) than the pass voltage window in FIG. 3. In FIG. 4, a voltage V3 represents the lowest level of the pass voltage Vpass for preventing program disturbance by the program voltage Vpgm from occurring. A voltage V4 represents the highest level of the pass voltage Vpass for preventing program disturbance by the pass voltage Vpass from occurring. That is, when a temperature increases, the range of the pass voltage Vpass (i.e., a pass voltage window) for preventing program disturbance from occurring becomes lower from a range V1 to V2 from a range V3 to V4.

Figure 5:
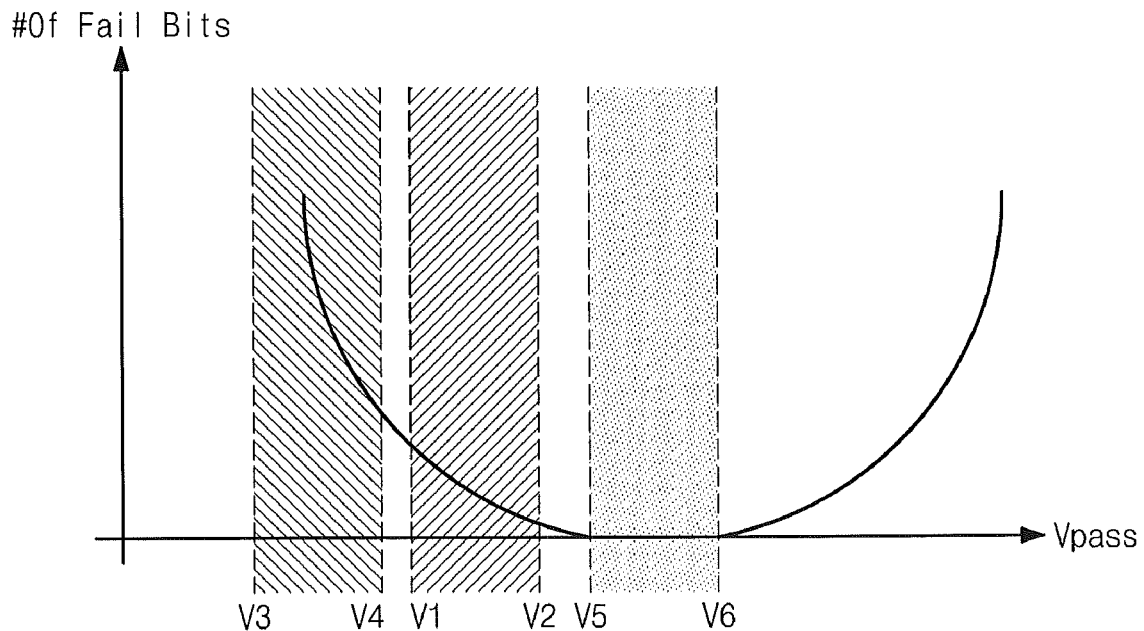
FIG. 5 is a diagram illustrating a pass voltage window at a lower temperature than the pass voltage window in FIG. 3.

FIG. 5 is a diagram illustrating a pass voltage window at a lower temperature (Te3) than the pass voltage window in FIG. 3. In FIG. 5, a voltage V5 represents the lowest level of the pass voltage Vpass for preventing program disturbance by the program voltage Vpgm from occurring. A voltage V6 represents the highest level of the pass voltage Vpass for preventing program disturbance by the pass voltage Vpass from occurring. That is, when a temperature decreases, the range of the pass voltage Vpass (i.e., a pass voltage window) for preventing program disturbance from occurring becomes higher from a range V1 to V2 from a range V5 to V6.

Referring to FIGS. 3 through 5, the pass voltage window varies with change of a peripheral temperature. At a temperature (Te1, for example, 20° C.), the pass voltage window is higher than the voltage V1 and is lower than the voltage V2. At a temperature (Te2) higher than the temperature (Te1), the pass voltage window is higher than the voltage V3 and is lower than the voltage V4. The maximum level V4 of the pass voltage window at the high temperature (Te2) is lower than the minimum level V1 of the pass voltage window at the temperature (Te1). Based on the pass voltage window at the temperature (Te1), program disturbance by the level of the pass voltage Vpass may occur. Due to fail bits caused by the program disturbance, a program operation may not be normally performed.

At a temperature (Te3) lower than the temperature (Te1), the pass voltage window is higher than the voltage V5 and is lower than the voltage V6. The minimum level V5 of the pass voltage window at the temperature (Te3) is higher than the maximum level V2 of the pass voltage window at the temperature (Te1). Based on the pass voltage window at the temperature (Te1) or the temperature (Te2) higher than the temperature (Te1), if the level of the pass voltage Vpass is set to the range V1 to V2 or the range V3 to V4, program disturbance by the program voltage Vpgm may occur at the temperature (Te3) lower than the temperature (Te1). Due to fail bits caused by the program disturbance, a program operation may not be normally performed.

Likewise, based on the pass voltage window at the temperature (Te3), if the level of the pass voltage Vpass is set to the range V5 to V6, program disturbance by the program voltage Vpgm may occur at the temperatures (Te1 and Te2) higher than the temperature (Te3). Based on the pass voltage window at the temperature (Te2), if the level of the pass voltage Vpass is set to the range V3 to V4, program disturbance by the pass voltage Vpass may occur at the temperatures (Te1 and Te3) lower than the temperature (Te2).

For solving the above-described limitations, the flash memory device 200 according to an embodiment of the present invention varies the level of the pass voltage Vpass with a peripheral temperature. For example, when a peripheral temperature increases, the flash memory device 200 decreases the level of the pass voltage Vpass. When a peripheral temperature decreases, the flash memory device 200 increases the level of the pass voltage Vpass.

Figure 6:
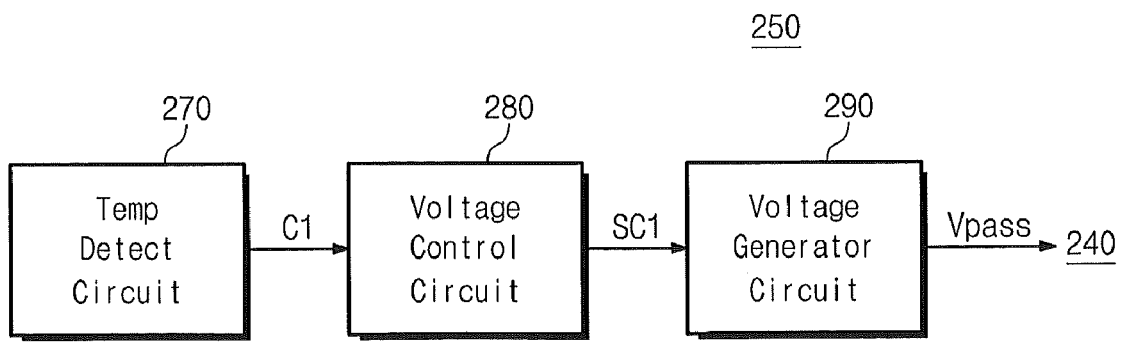
FIG. 6 is a block diagram illustrating the voltage generator of the flash memory device in FIG. 2.

FIG. 6 is a block diagram illustrating the voltage generator 250 of the flash memory device 200 in FIG. 2.

Referring to FIG. 6, the voltage generator 250 according to an embodiment of the present invention includes a temperature detection circuit 270, a voltage control circuit 280, and a voltage generation circuit 290.

The temperature detection circuit 270 detects a peripheral temperature and outputs the detected temperature as a code C1. For example, the code C1 may be configured with octal two bits. The output code C1 is transferred to the voltage control circuit 280.

The voltage control circuit 280 converts the detected temperature into a control signal for varying the pass voltage Vpass. The voltage control circuit 280 receives the code C1, which represents a peripheral temperature, from the temperature detection circuit 270. The voltage control circuit 280 outputs a step code SC1 for varying the pass voltage Vpass in response to the code C1.

The voltage generation circuit 290 varies the level of the pass voltage Vpass in response to the step code SC1 that is transferred from the voltage control circuit 280. The varied pass voltage Vpass is provided to the row decoder 240.

Figure 7:
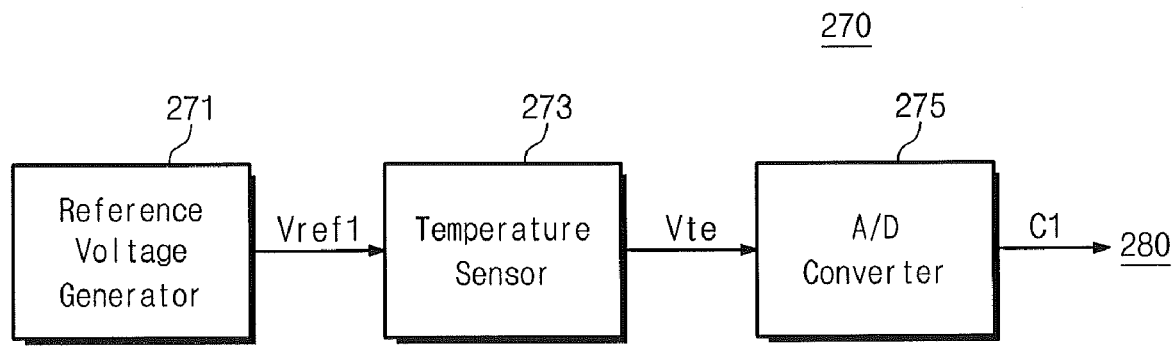
FIG. 7 is a block diagram illustrating a temperature detection circuit in FIG. 6.

FIG. 7 is a block diagram illustrating the temperature detection circuit 270 in FIG. 6.

Referring to FIG. 7, the temperature detection circuit 270 includes a reference voltage generator 271, a temperature sensor 273, and an analog-to-digital (A/D) converter 275.

The reference voltage generator 271 generates a reference voltage Vref1. The reference voltage Vref1 is transferred to the temperature sensor 273. The temperature sensor 271 receives the reference voltage Vref1 from the reference voltage generator 271, and converts the reference voltage Vref1 into a temperature voltage Vte corresponding to a peripheral temperature to output the temperature voltage Vte. For example, the temperature sensor 273 may include at least one element such as a diode including a temperature coefficient component. The A/D converter 275 receives the temperature voltage Vte from the temperature sensor 273 and digitizes the received temperature voltage Vte. The digitized temperature voltage is output as the code C1. As an example, the code C1 may be configured with octal two bits. The code C1 may be a signal representing a peripheral temperature.

Figure 8:
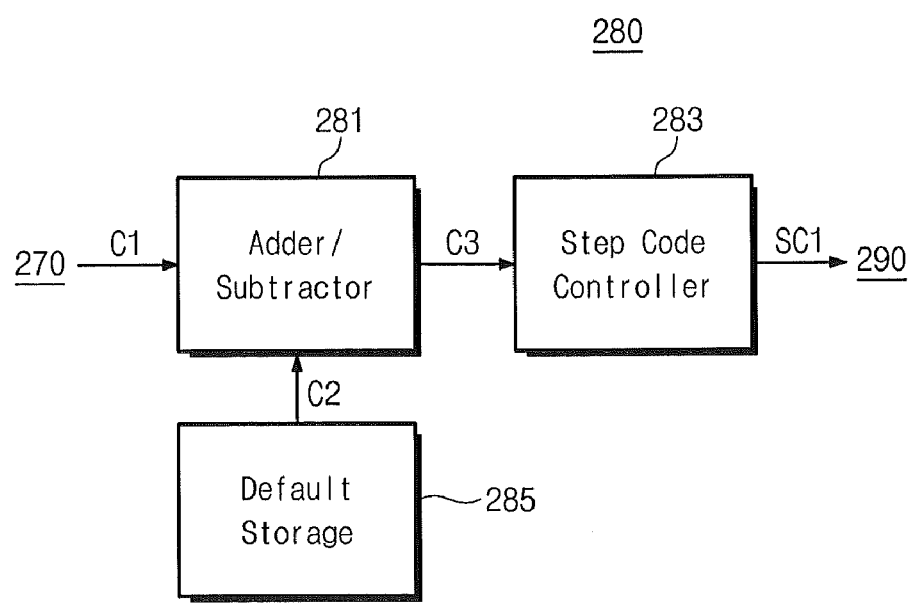
FIG. 8 is a block diagram illustrating a voltage control circuit in FIG. 6.

FIG. 8 is a block diagram illustrating the voltage control circuit 280 in FIG. 6.

Referring to FIG. 8, the voltage control circuit 280 includes an adder/subtractor 281, a step code controller 283, and a default storage circuit 285.

The default storage circuit 285 stores a code value C2 corresponding to a reference temperature. As an example, a reference temperature is an ordinary temperature (for example, 20° C.). The default storage circuit 285 may store the code value C2 corresponding to the ordinary temperature (for example, 20° C.). The default storage circuit 285 may be a fuse circuit that stores the code C2 corresponding to the reference temperature. For example, the default storage circuit 285 may be configured with an electrical fuse or a laser fuse. As another example, the default storage circuit 285 may be configured with a storage means such as a latch for storing the code C2 corresponding to the reference temperature. The code C2 corresponding to the reference temperature is transferred to the adder/subtractor 281.

The adder/subtractor 281 receives the code C1 corresponding to a peripheral temperature from the temperature detection circuit 270, and receives the code C2 corresponding to the reference temperature from the default storage circuit 285. The adder/subtractor 281 operates the codes C1 and C2 to calculate a code corresponding to a peripheral temperature and the reference temperature. As an example, the adder/subtractor 281 may output the sum of the codes C1 and C2. As another example, the adder/subtractor 281 may output the difference of the codes C1 and C2.

It is assumed that the adder/subtractor 281 calculates the difference between the code C2 corresponding to the reference temperature and the code C1 corresponding to a peripheral temperature. The adder/subtractor 281 outputs a code C3 corresponding to the difference of the reference temperature and a peripheral temperature. The step code controller 283 receives the code C3 corresponding to the difference of the reference temperature and the peripheral temperature from the adder/subtractor 281. The step code controller 283 outputs the step code SC1 for controlling the pass voltage Vpass in response to the code C3. The signal SC1 is provided to the voltage generation circuit 290.

Figure 9:
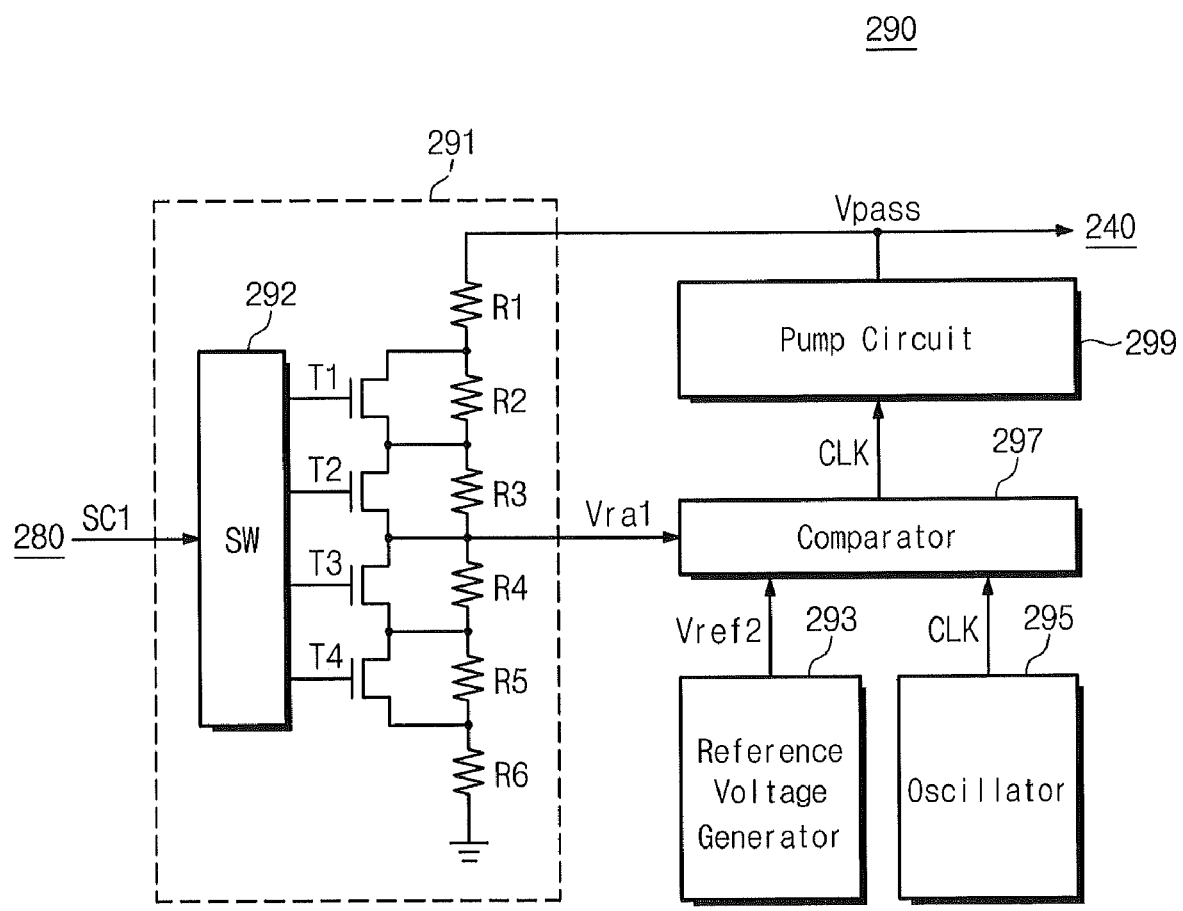
FIG. 9 is a block diagram illustrating a voltage generation circuit in FIG. 6.

FIG. 9 is a block diagram illustrating the voltage generation circuit 290 in FIG. 6.

Referring to FIG. 9, the voltage generation circuit 290 includes a voltage divider 291, a reference voltage generator 293, an oscillator 295, a comparator 297, and a pump circuit 299.

The voltage divider 291 receives the step code SC1 from the voltage control circuit 280. The voltage divider 291 divides the pass voltage Vpass in response to the step code SC1 and outputs the divided voltage as a voltage Vra1. The voltage divider 291 includes a switch circuit 292, transistors T1 to T4, and resistors R1 to R6.

The resistors R1 to R6 are connected in series. The resistor R6 is connected to a ground terminal, and the resistor R1 receives the pass voltage Vpass that is outputted from the pump circuit 299. That is, the resistors R1 to R6 divide the pass voltage Vpass. The voltage Vra1 of a node between the resistors R3 and R4 is outputted to the comparator 297.

The resistors R2 to R5 are respectively connected to the transistors T1 to T4 in parallel. The transistors T1 to T4 are controlled by a switch circuit SW. A switch circuit 292 turns on/off the transistors T1 and T2 in response to the step code SC1. For example, the switch circuit 292 may include high-voltage switches for turning on/off the transistors T1 to T4. The transistors T1 to T4 may be high-voltage transistors.

For example, when the transistor T2 is turned on, the resistor R3 becomes short. Accordingly, the level of the voltage Vra1 further increases than when the transistor T2 is turned off. When the transistor T3 is turned on, the resistor R4 becomes short. Accordingly, the level of the voltage Vra1 further decreases than when the transistor T3 is turned off. That is, the resistors R1 to R3 and the transistors T1 and T2 operate as an up-trim circuit for controlling the level of the voltage Vra1, and the resistors R4 to R6 and the transistors T3 and T4 operate as a down-trim circuit for controlling the level of the voltage Vra1. Furthermore, the level of the voltage Vra1 may be controlled in response to the step code SC1 that is transferred from the voltage control circuit 280.

The comparator 297 receives a reference voltage Vref2 that is generated from the reference voltage generator 293. The comparator 297 receives the reference voltage Vref2 from the reference voltage generator 293 and receives a clock CLK from the oscillator 295. When a peripheral temperature is a temperature corresponding to the code C2 that is stored in the default storage circuit 285 (see FIG. 8) of the voltage control circuit 280, the reference voltage Vref2 may be a voltage for generating the pass voltage Vpass so that the pass voltage Vpass may have a predetermined level within a pass window range (for example, the range V1 to V2 in FIG. 5).

The comparator 297 compares the voltage Vra1 with the reference voltage Vref2, and transfers the clock CLK, which is provided from the oscillator 295, to the pump circuit 299 according to the comparison result. The pump circuit 299 boosts the pass voltage Vpass in response to the clock CLK. The pass voltage Vpass is transferred to the voltage divider 291 and the row decoder 240.

As an example, when the voltage Vra1 is lower than the reference voltage Vref2, the comparator 297 provides the clock CLK from the oscillator 295 to the pump circuit 299. When the voltage Vra1 is higher than the reference voltage Vref2, the comparator 297 does not provide the clock CLK from the oscillator 295 to the pump circuit 299. That is, the pump circuit 299 boosts the pass voltage Vpass so that the level of the voltage Vra1 can be the same as that of the reference voltage Vref2.

Referring to FIGS. 6 to 9, the temperature detection circuit 270 detects a peripheral temperature and outputs the code C1 corresponding to the peripheral temperature. The voltage control circuit 280 calculates the difference between the code C1 corresponding to a peripheral temperature and the code C2 corresponding to the reference temperature, and outputs the step code SC1 for controlling the pass voltage Vpass based on the calculation result. The voltage generation circuit 290 boosts the pass voltage Vpass so that the level of the voltage Vra1 can be the same as that of the reference voltage Vref2. The voltage Vra1 is a voltage which is divided from the pass voltage Vpass, and a division rate is controlled by the step code SC1. That is, the level of the pass voltage Vpass may be controlled with a peripheral temperature.

As an example, at a temperature (Te1, for example, 20° C.), the range of the pass voltage window may be the range V1 to V2. At this point, the voltage generator 250 generates the pass voltage Vpass within the range V1 to V2 of the pass voltage window (see FIG. 4). That is, the comparator 297 provides the clock CLK to the pump circuit 299 so that the level of the voltage Vra1 can be the same as that of the reference voltage Vref2.

When a peripheral temperature is changed into the temperature (Te2) higher than the temperature (Te1), the range of the pass voltage window is changed from the range V1 to V2 to the range V3 to V4. At this point, at least one of the transistors T3 and T4 is turned on in response to the step code SC1. Since the level of the voltage Vra1 is higher than that of the reference voltage Vref2, the comparator 297 does not provide the clock CLK to the pump circuit 299 until the level of the voltage Vra1 is the same as that of the reference voltage Vref2. That is, the level of the pass voltage Vpass continuously decreases until the level of the voltage Vra1 is the same as that of the reference voltage Vref2. The voltage generator 250 controls the pass voltage Vpass so that the level of the pass voltage Vpass may be controlled to the pass voltage window range V3 to V4 at the temperature (Te2) when the level of the voltage Vra1 is the same as that of the reference voltage Vref2.

When a peripheral temperature is changed into the temperature (Te3) lower than the temperature (Te1), the range of the pass voltage window is changed from the range V1 to V2 to the range V5 to V6. At this point, at least one of the transistors T1 and T2 is turned on in response to the step code SC1. Since the level of the voltage Vra1 is lower than that of the reference voltage Vref2, the comparator 297 provides the clock CLK to the pump circuit 299 until the level of the voltage Vra1 is the same as that of the reference voltage Vref2. That is, the level of the pass voltage Vpass continuously increases until the level of the voltage Vra1 is the same as that of the reference voltage Vref2. The voltage generator 250 controls the pass voltage Vpass so that the level of the pass voltage Vpass may be controlled to the pass voltage window range V5 to V6 at the temperature (Te3) when the level of the voltage Vra1 is the same as that of the reference voltage Vref2.

As described above, the flash memory device 200 according to an embodiment of the present invention varies the level of the pass voltage Vpass with change of a peripheral temperature. Therefore, program disturbance by the change of the peripheral temperature is prevented. That is, the flash memory device 200 normally operates in spite of the change of the peripheral temperature.

Figure 10:
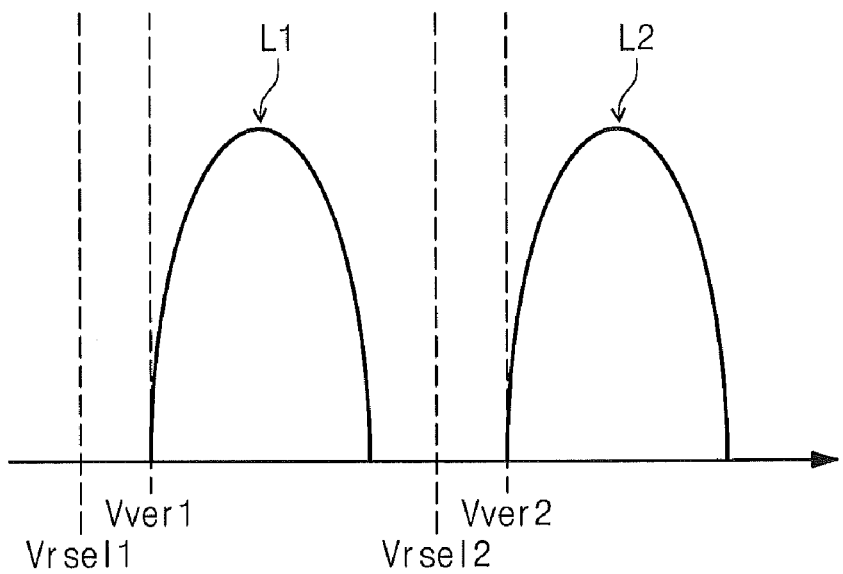
FIG. 10 is a diagram illustrating the threshold voltage distribution of the memory cells of the flash memory device in FIG. 2.

FIG. 10 is a diagram illustrating the threshold voltage distribution of the memory cells MC of the flash memory device 200 in FIG. 2. In FIG. 10, the abscissa axis represents a voltage, and the ordinate axis represents the number of memory cells. For conciseness, the threshold voltage distribution of the erasion states of the memory cells MC is not shown, and it is assumed that the memory cells MC are programmed from an erasion state into two logic states. However, the number of logic states to be programmed and the logic states of the memory cells may not be limited. Moreover, it is assumed that the memory cells MC are programmed at a temperature (Te4).

The memory cells MC, which are programmed into a first logic state L1, are verified with a verification voltage Vver1. The memory cells MC that are programmed into a first logic state L1, that is, are program-passed when having a threshold voltage higher than the verification voltage Vver1. The memory cells MC, which are programmed into a second logic state L2, are verified with a verification voltage Vver2. The memory cells MC that are programmed into the second logic state L2, that is, are program-passed when having a threshold voltage higher than the verification voltage Vver2.

In read operation, selection read voltages Vrsel1 and Vrsel2 are used for determining the logic state of the memory cell MC. When the threshold voltage of the memory cell MC is lower than the selection read voltage Vrsel1, this is determined as an erasion state. When the threshold voltage of the memory cell MC is higher than the selection read voltage Vrsel1 and is lower than the selection read voltage Vrsel2, this is determined as the first logic state L1. When the threshold voltage of the memory cell MC is higher than the selection read voltage Vrsel2, this is determined as a second logic state L2.

Figure 11:
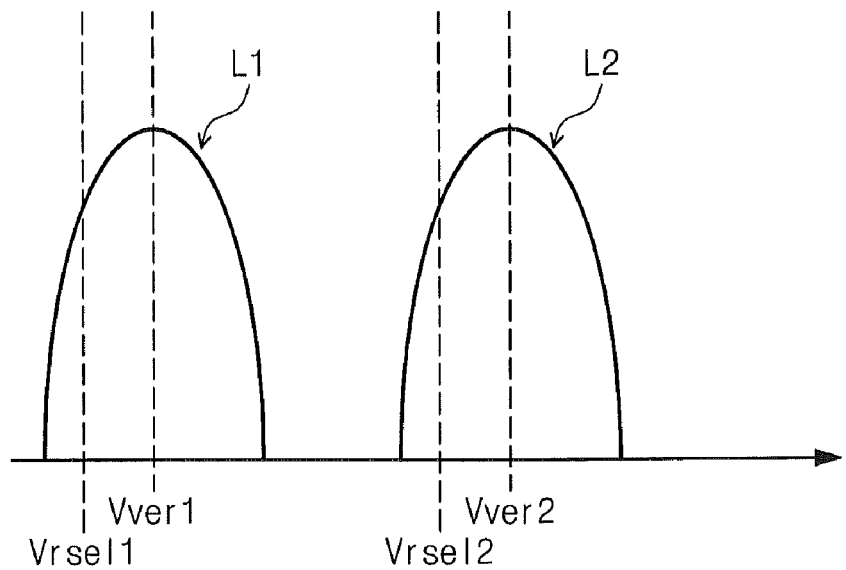
FIG. 11 is a diagram illustrating the threshold voltage distribution of the memory cells when a read operation is performed at a temperature higher than a temperature in programming.

FIG. 11 is a diagram illustrating the threshold voltage distribution of the memory cells MC when a read operation is performed at a temperature (Te5) higher than the temperature (Te4) in programming. In FIG. 11, the abscissa axis represents a voltage, and the ordinate axis represents the number of memory cells. The temperature (Te5) at which the read operation is performed is higher than the temperature (Te4) at which a program operation is performed.

As described above with reference to FIG. 10, the memory cells MC are programmed to have a threshold voltage higher than the threshold voltage Vver1 or the threshold voltage Vver2. The logic states of the memory cells MC are determined by use of the selection read voltages Vrsel1 and Vrsel2. As illustrated in FIG. 11, when the peripheral temperature (Te5) in the read operation further increases than the temperature (Te4) in the program operation, the threshold voltages of the memory cells MC decrease. A portion of the memory cells MC (which are in the first logic state L1), which are programmed to have a threshold voltage higher than the verification voltage Vver1, has a threshold voltage lower the verification voltage Vver1, and the other cells have a threshold voltage lower than the selection read voltage Vrsel1. A portion of the memory cells MC (which are in the second logic state L2), which are programmed to have a threshold voltage higher than the verification voltage Vver2, has a threshold voltage lower than the verification voltage Vver2, and the other cells have a threshold voltage lower than the selection read voltage Vrsel2. That is the memory cells MC that are programmed into the first logic state L1 may be determined as being in the erasion state, and the memory cells MC that are programmed into the second logic state L2 may be determined as being in the first logic state L1.

Likewise, when the read operation is performed at a temperature (Te6) higher than the temperature (Te4) in the program operation, the threshold voltages of the memory cells MC may increase. At this point, the memory cells MC of the erasion state may be determined as being in the first logic state L1, and the memory cells MC of the first logic state L1 may be determined as being in the second logic state L2.

For preventing the above-described limitations, the flash memory device 200 according to an embodiment of the present invention varies the selection read voltages Vrsel1 and Vrsel2 that are applied to a selected word line in the read operation, a read voltage Vread that is applied to a non-selected word line in the read operation, the verification voltages Vver1 and Vver2 and the program voltage Vpgm, with a peripheral temperature. As an example, the flash memory device 200 compares a peripheral temperature with the reference temperature, and varies the program voltage Vpgm, the verification voltages Vver1 and Vver2 and the pass voltage Vpass so that the threshold voltages of the memory cells MC may have the difference with a threshold voltage at the reference temperature by the difference between a peripheral temperature and the reference temperature in programming. The flash memory device 200 compares a peripheral temperature with the reference temperature, and varies the selection read voltages Vrsel1 and Vrsel2 and the read voltage Vread so that the threshold voltages of the memory cells MC may be compensated by the difference between the peripheral temperature and the reference temperature from a threshold voltage at the reference temperature and thereby the read operation may be performed.

As described above with reference to FIG. 6, the voltage generator 250 generates the program voltage Vpgm/read voltage Vread with the temperature detection circuit 270, the voltage control circuit 280 and the voltage generation circuit 290. As described above with reference to FIG. 7, the temperature detection circuit 270 detects a peripheral temperature to output the code C1.

As described above with reference to FIG. 8, the voltage control circuit 280 operates the code C1 corresponding to a peripheral temperature and the code C2 corresponding to the reference temperature to output the code C3, and outputs the step code SC1 in response to the code C3. The step code SC1 may be a signal for controlling the program voltage Vpgm/ read voltage Vread.

As described above with reference to FIG. 9, the voltage generation circuit 290 divides the program voltage Vpgm/ read voltage Vread in response to the step code SC1 and outputs the voltage Vra1 as the division result. The comparator 297 compares the voltage Vra1 and the reference voltage Vref2 to provide the clock CLK to the pump circuit 299. As an example, when the voltage Vra1 is lower than the reference voltage Vref2, the comparator 297 provides the clock CLK to the pump circuit 299. As another example, when the voltage Vra1 is higher than the reference voltage Vref2, the comparator 297 provides the clock CLK to the pump circuit 299. The pump circuit 299 controls the level of the program voltage Vpgm/read voltage Vread in response to the clock CLK.

The voltage generator 250 that has been described above with reference to FIGS. 6 through 9 generates the pass voltage Vpass, the program voltage Vpgm and the read voltage Vread. However, the voltage generator 250 that has been described above with reference to FIGS. 6 through 9 is an element for generating a high voltage, and it is not limited to an element for generating the pass voltage Vpass, the program voltage Vpgm and the read voltage Vread. As an example, in the program operation of the flash memory device 200 in FIG. 2, the voltage generator 250 generates the program voltage Vpgm, the read voltage Vread and different pass voltages when different pass voltages are respectively applied to the word lines WL1 to WLn.

The voltage generator 250 of the flash memory device 200 in FIG. 2 generates the selection read voltage Vrsel/verification voltage Vver that is applied to a selected word line in the read operation. As described above with reference to FIG. 6, the voltage generator 250 generates the selection read voltage Vrsel/verification voltage Vver with the temperature detection circuit 270, the voltage control circuit 280 and the voltage generation circuit 290.

The temperature detection circuit 270, as described above with reference to FIG. 6, detects a peripheral temperature to output the code C1.

Figure 12:
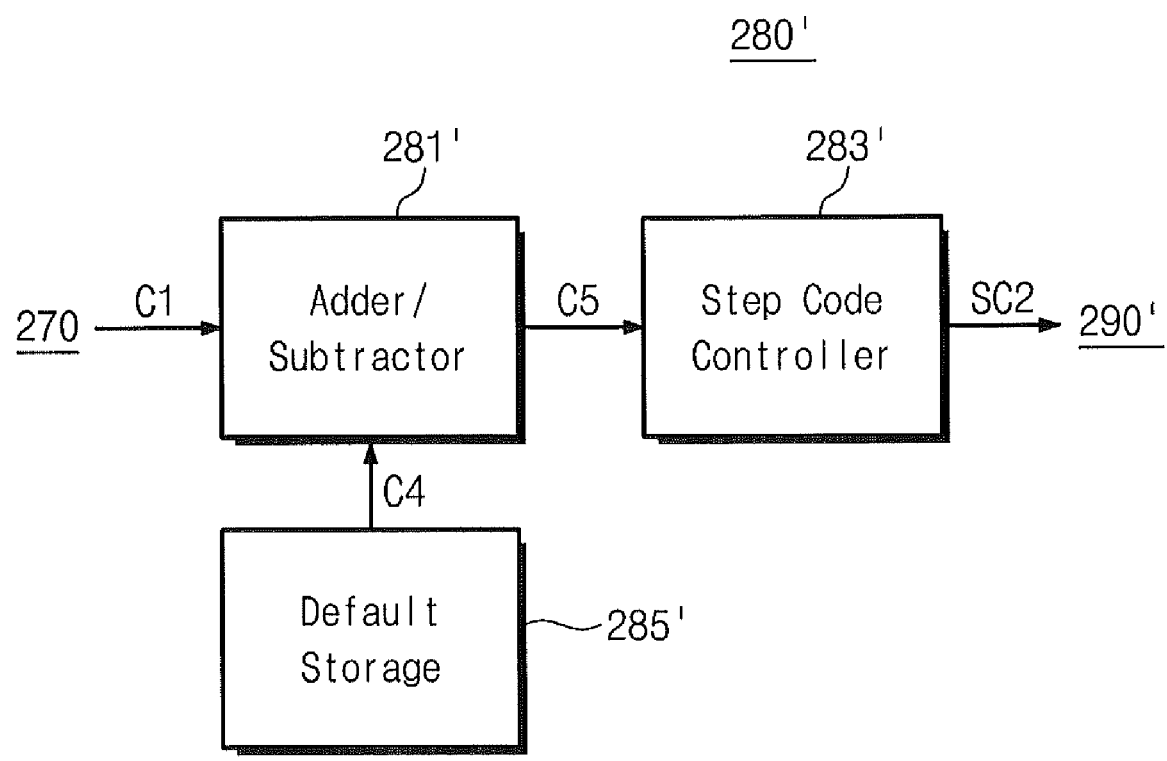
FIG. 12 is a block diagram illustrating a voltage control circuit for generating a selection read voltage/verification voltage.

FIG. 12 is a block diagram illustrating a voltage control circuit 280' for generating the selection read voltage Vrsel/verification voltage Vver.

Referring to FIG. 12, a voltage control circuit 280' includes an adder/subtractor 281', a step code controller 283', and a default storage circuit 285'.

The default storage circuit 285' stores a code C4 corresponding to the reference temperature. The adder/subtractor 281' operates the code C1 corresponding to a peripheral temperature and the code C4 corresponding to the reference temperature to output a code C5. As an example, the adder/subtractor 281' outputs the sum or difference of the codes C1 and C4 as the code C5. It is assumed that the adder/subtractor 281' outputs the difference of the codes C1 and C4 as the code C5. The step code controller 283' outputs a step code SC2 for controlling the selection read voltage Vrsel/verification voltage Vver, in response to the code C5 representing the difference of a peripheral temperature and the reference temperature. The step code SC2 is transferred to a voltage generation circuit 290'.

Figure 13:
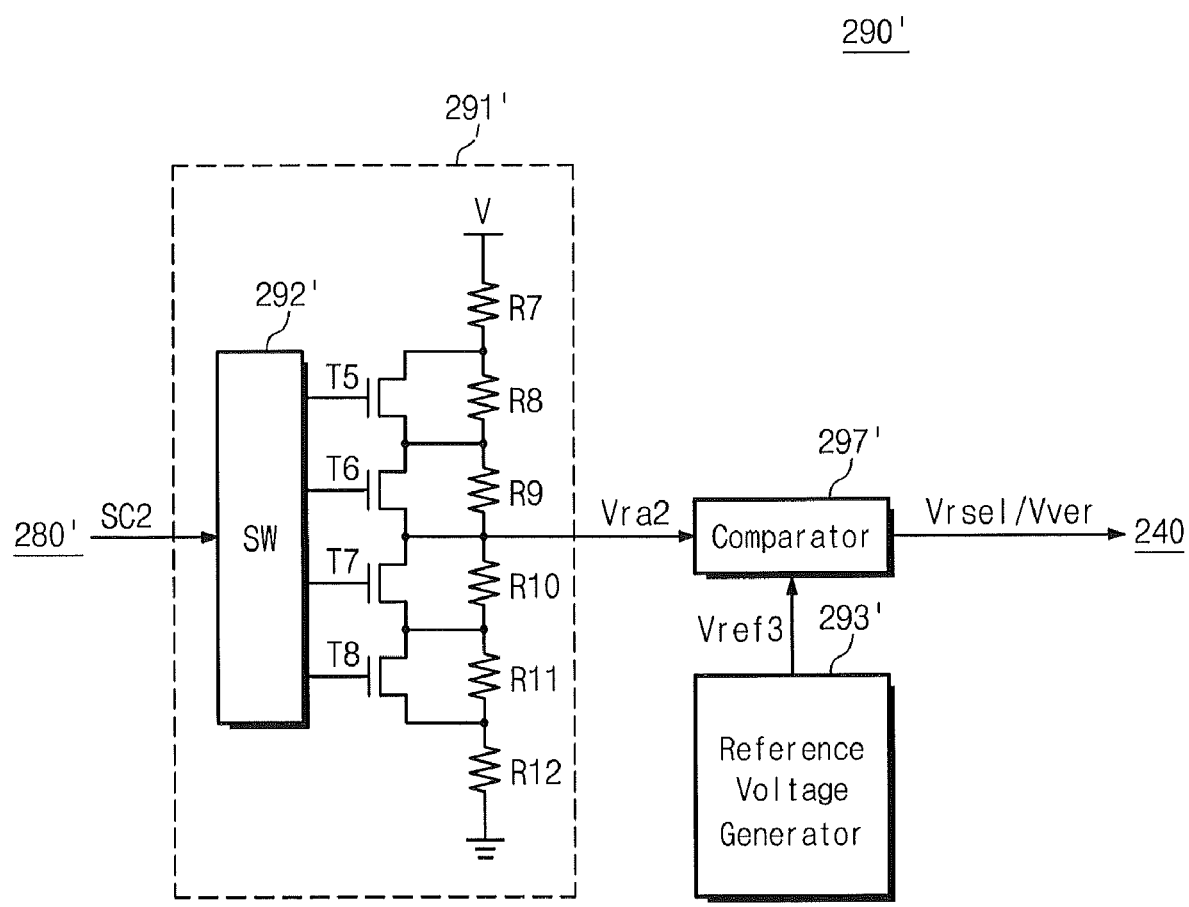
FIG. 13 is a block diagram illustrating a voltage generation circuit for generating the selection read voltage/verification voltage.

FIG. 13 is a block diagram illustrating a voltage generation circuit 290' for generating the selection read voltage Vrsel/verification voltage Vver.

Referring to FIG. 13, a voltage generation circuit 290' includes a voltage divider 291', a reference voltage generator 293', and a comparator 297'.

The voltage divider 291' includes a switch circuit 292', resistors R7 to R12, and transistors T5 to T8. The resistor R7 is connected to a voltage V terminal, and the resistor R12 is connected to a ground terminal. As an example, a voltage V may be a power supply source voltage Vcc or a high voltage Vpp. The resistors R7 to R12 divide the voltage V. The voltage Vra2 of a node between the resistors R9 and R10 is transferred to the comparator 297'. The resistors R8 to R11 are respectively connected to the transistors T5 to T8 in parallel. The switch circuit 292' turns on/off the transistors T5 to T8 in response to the step code SC2.

The reference voltage generator 293' generates a reference voltage Vref3 for generating the selection read voltage Vrsel/verification voltage Vver corresponding to the reference temperature. The comparator 297' compares the reference voltage Vref3 and the voltage Vra2, and generates the selection read voltage Vrsel/verification voltage Vver according to the comparison result.

Referring to FIGS. 10 and 13, at the temperature (Te1, for example, 20° C.), the comparator 297' outputs the selection read voltage Vrsel/verification voltage Vver in response to the level of the reference voltage Vref3/voltage Vra2.

As an example, the comparator 297' amplifies the level difference of the reference voltage Vref3 and the voltage Vra2, and output the amplified voltage as the selection read voltage Vrsel/verification voltage Vver. It is assumed that the reference voltage Vref3 is higher than the voltage Vra2 and the comparator 297' amplifies the level, in which the voltage Vra2 is subtracted from the reference voltage Vref3, to output the selection read voltage Vrsel/verification voltage Vver. However, the comparator 297' may also amplify the level, in which the reference voltage Vref3 is subtracted from the voltage Vra2, to output the selection read voltage Vrsel/verification voltage Vver.

As an example, the comparator 297' compares the level difference of the reference voltage Vref3 and the voltage Vra2, and selects the level of the selection read voltage Vrsel/verification voltage Vver based on the compare result. For example, the comparator 297' may include a table indicating relations between the level of the selection read voltage Vrsel/verification voltage Vver and the level difference of the reference voltage Vref3 and the voltage Vra2. The comparator 297' may select the level of the selection read voltage Vrsel/verification voltage Vver referring to the table and the level difference of the reference voltage Vref3 and the voltage Vra2

When a peripheral temperature is changed into the temperature (Te5) higher than the temperature (Te4), the switch circuit 292' turns on at least one of the transistors T5 and T6 in response to the step code SC2. Since the resistor that is connected to the turned-on transistor becomes short, the level of the voltage Vra2 increases. Accordingly, the difference between the reference voltage Vref3 and the voltage Vra2 decreases, and the level of the selection read voltage Vrsel/verification voltage Vver decreases.

On the other hand, when a peripheral temperature is changed into a temperature (Te6) lower than the temperature (Te4), the switch circuit 292' turns on at least one of the transistors T7 and T8 in response to the step code SC2. Since the resistor that is connected to the turned-on transistor becomes short, the level of the voltage Vra2 decreases. Accordingly, the difference between the reference voltage Vref3 and the voltage Vra2 increases, and the level of the selection read voltage Vrsel/verification voltage Vver increases.

It is assumed that the reference temperature is the temperature (Te4). When the program operation is performed at the temperature (Te5) higher than the reference temperature (Te4), the flash memory device 200 decreases the level of the verification voltage Vver. The verification voltage Vver may be controlled by a level corresponding to the difference between the threshold voltages of the memory cells MC at the reference temperature (Te4) and the threshold voltages of the memory cells MC at the temperature (Te5). That is, the memory cells MC may have threshold voltages such as that in which they are programmed at the reference temperature (Te4).

When the program operation is performed at the temperature (Te6) lower than the reference temperature (Te4), the flash memory device 200 increases the level of the verification voltage Vver. The verification voltage Vver may be controlled by a level corresponding to the difference between the threshold voltages of the memory cells MC at the reference temperature (Te4) and the threshold voltages of the memory cells MC at the temperature (Te6). That is, the memory cells MC may have threshold voltages such as that in which they are programmed at the reference temperature (Te4).

When the read operation is performed at the temperature (Te5) higher than the reference temperature (Te4), the flash memory device 200 decreases the level of the selection read voltage Vrsel. The selection read voltage Vrsel may be controlled by a level corresponding to the difference between the threshold voltages of the memory cells MC at the reference temperature (Te4) and the threshold voltages of the memory cells MC at the temperature (Te5). That is, the level of the selection read voltage Vrsel may be compensated by a level corresponding to the difference between the threshold voltages of the memory cells MC at the reference temperature (Te4) and the threshold voltages of the memory cells MC at the temperature (Te5) and thereby the read operation is performed.

When the read operation is performed at the temperature (Te6) lower than the reference temperature (Te4), the flash memory device 200 increases the level of the selection read voltage Vrsel. The selection read voltage Vrsel may be controlled by a level corresponding to the difference between the threshold voltages of the memory cells MC at the reference temperature (Te4) and the threshold voltages of the memory cells MC at the temperature (Te6). That is, the level of the selection read voltage Vrsel may be compensated by a level corresponding to the difference between the threshold voltages of the memory cells MC at the reference temperature (Te4) and the threshold voltages of the memory cells MC at the temperature (Te6) and thereby the read operation is performed.

In the above-described embodiments, it has been described that the voltage detection circuit 270, the voltage control circuit 280' and the voltage generation circuit 290' generate the selection read voltage Vrsel and the verification voltage Vver. However, the voltage detection circuit 270, the voltage control circuit 280' and the voltage generation circuit 290' generate a voltage having a level lower than a high voltage such as the program voltage Vpgm, the pass voltage Vpass and the read voltage Vread, and they are not limited to the generation of the selection read voltage Vrsel and the verification voltage Vver.

As described above, the flash memory device 200 varies the level of the level of the pass voltage Vpass, the level of the program voltage Vpgm, the level of the verification voltage Vver, the level of the read voltage Vread and the level of the selection read voltage Vrsel, with change of a peripheral temperature. Accordingly, an operation error based on the change of the peripheral temperature is prevented/decreased.

Figure 14:
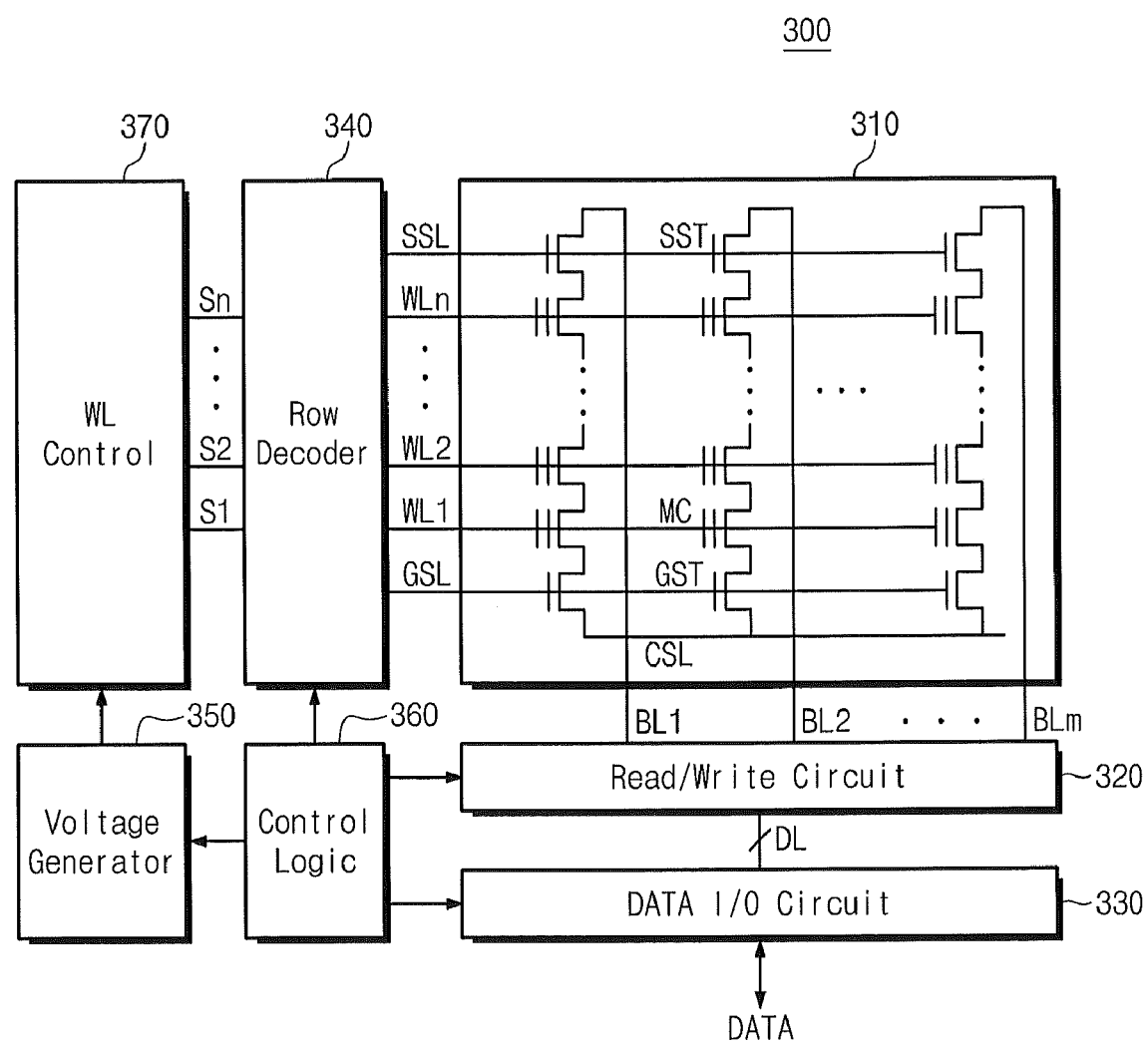
FIG. 14 is a block diagram illustrating a flash memory device according to another embodiment of the present invention.

FIG. 14 is a block diagram illustrating a flash memory device according to another embodiment of the present invention.

Referring to FIG. 14, a flash memory device 300 according to another embodiment of the present invention includes a memory cell array 310, a read/write circuit 320, a data I/O circuit 330, a row decoder 340, a voltage generator 350, a control logic 360, and a word line (WL) controller 370.

The memory cell array 310, the read/write circuit 320, the data I/O circuit 330, the row decoder 340, the voltage generator 350 and the control logic 360 have the same functions as those of the memory cell array 210, the read/write circuit 220, the data I/O circuit 230, the row decoder 240, the voltage generator 250 and the control logic 260 that have been described above with reference to FIGS. 2 through 13. Therefore, detailed description on the elements 310, 320, 330, 340, 350 and 360 will be omitted. The word line controller 370 receives a program voltage Vpgm, a verification voltage Vver, pass voltages Vpass1 and Vpass2, a read voltage Vread and a selection read voltage Vrsel from the voltage generator 350, and transfers the received voltages to the row decoder 340 through lines S1 to Sn.

Figure 15:
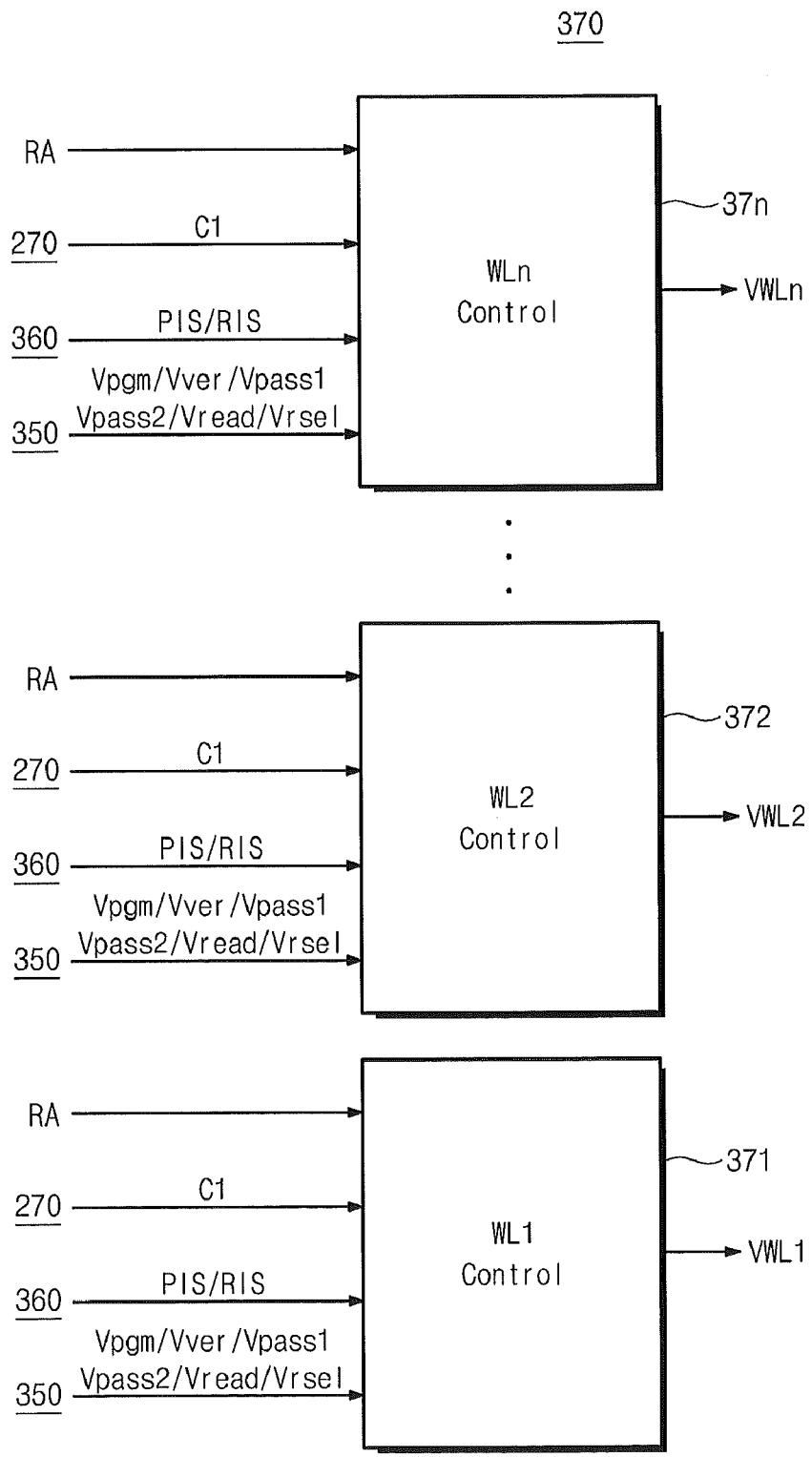
FIG. 15 is a block diagram illustrating a word line controller in FIG. 14.

FIG. 15 is a block diagram illustrating the word line controller 370 in FIG. 14.

Referring to FIG. 15, the word line controller 370 includes a plurality of controllers 371 to 37n. The controllers 371 to 37n correspond to word lines WL1 to WLn, respectively. The controllers 371 to 37n output word line voltages VWL1 to VWLn, which are respectively provided to corresponding word lines among the word lines WL1 to WLn, through the row decoder 340.

The controller 37n receives the program voltage Vpgm, the verification voltage Vver, the pass voltages Vpass1 and Vpass2, the read voltage Vread and the selection read voltage Vrsel from the voltage generator 350. Each of controllers 371 to 37n selects any one of the program voltage Vpgm, the verification voltage Vver, the pass voltages Vpass1 and Vpass2, the read voltage Vread and the selection read voltage Vrsel and outputs the selected voltage to a corresponding word line, in response to a row address RA.

The controller 37n outputs the selected voltage of the program voltage Vpgm, the verification voltage Vver and the pass voltages Vpass1 and Vpass2 as the word line voltage VWLn during a predetermined section, in response to a program interval signal PIS that is transferred from the control logic 360. The controller 37n controls timing in which the selected voltage of the program voltage Vpgm and the pass voltages Vpass1 and Vpass2 is outputted as the word line voltage VWLn during the predetermined section, in response to a code C1 corresponding to a peripheral temperature that is provided from a temperature detection circuit. That is, the word line controller 370 controls timing in which the program voltage Vpgm and the pass voltages Vpass1 and Vpass2 are applied to the word lines WL1 to WLn.

The controller 37n outputs the selected voltage of the read voltage Vread and the selection read voltage Vrsel as the word line voltage VWLn during a predetermined section, in response to a read interval signal RIS that is transferred from the control logic 360. For example, the controllers 371 to 37n may be configured in the same structure.

Figure 16:
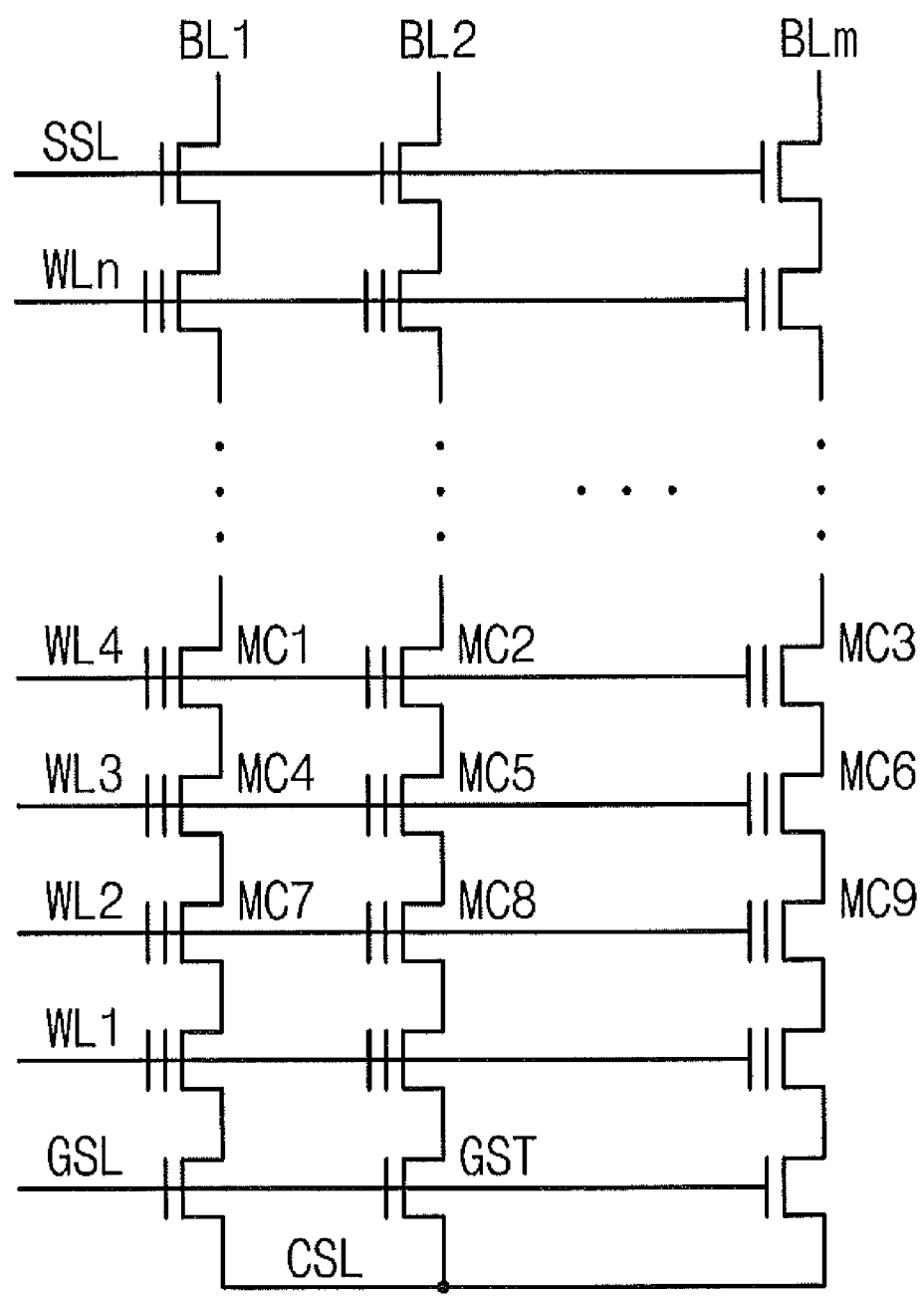
FIGS. 16 through 18 are diagrams illustrating the program operation of the flash memory device in FIG. 14.
Figure 17:
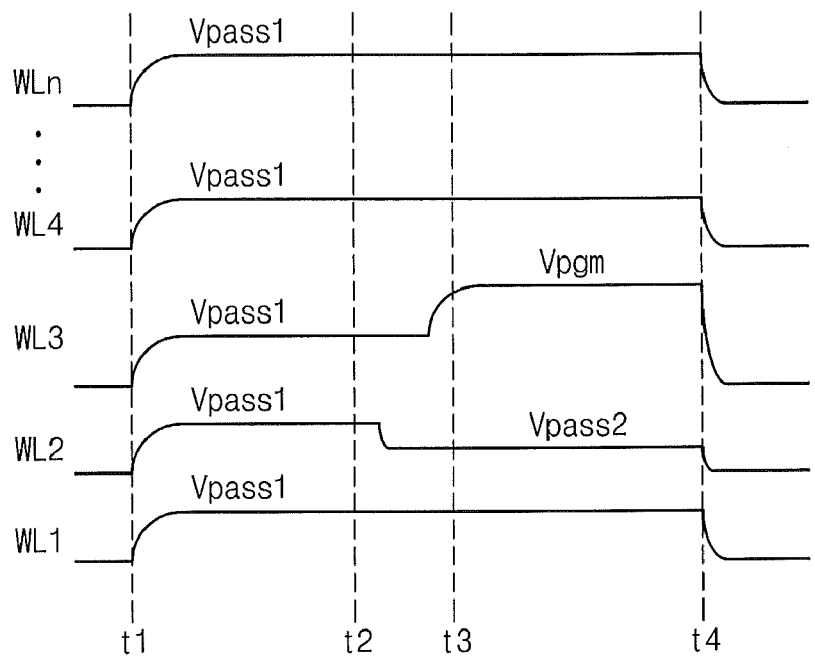
Figure 18:
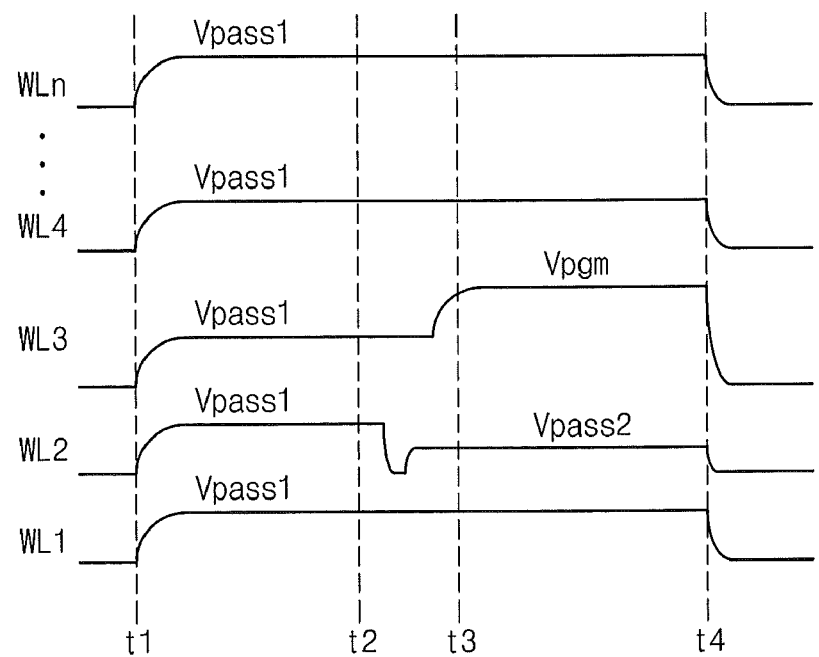

FIGS. 16 through 18 are diagrams illustrating the program operation of the flash memory device 300 in FIG. 14. A portion of the memory cell array 310 of the flash memory device 300 in FIG. 14 is illustrated in FIG. 16. Hereinafter, it is assumed that a memory cell MC4 is programmed. At this point, a bit line BL1 is set up to a ground voltage Vss, and other bit lines BL2 to BLm are set up to a power supply source voltage Vcc.

FIG. 17 is a timing diagram illustrating bias voltages which are applied to the memory cell array 310 of FIG. 16 in a program operation.

Referring to FIGS. 16 and 17, in a section 't1-t2', the pass voltage Vpass1 is applied to the word lines WL1 to WLn. The pass voltage Vpass1 has a level, which varies with a peripheral temperature, lest program disturbance by the pass voltage Vpass1 and the program voltage Vpgm occurs.

In a section 't2-t3', the pass voltage Vpass2 lower than the pass voltage Vpass1 and higher than a ground voltage Vss is applied to the word line WL2, which is disposed between a selection word line WL3 and a ground selection ling GSL, adjacent to the selection word line WL3. That is, the pass voltage Vpass2 is applied to the control gate of a memory cell MC8. In the section 't1-t2', when the pass voltage Vpass2 is lower than the boosted channel voltage of a memory cell MC11, the memory cell MC8 is turned off. When the difference of the pass voltage Vpass2 and the channel voltage of the memory cell MC8 is smaller than the sum of the threshold voltage of the memory cell MC8 and the difference that is obtained by subtracting the channel voltage of the memory cell MC11 from the channel voltage of a memory cell MC5 (i.e., Vpass2−Vch_MC8<Vch_MC5−Vch_MC11+Vth_MC8), the memory cell MC8 is turned off. In the section 't2-t3', the program voltage Vpgm is applied to the word line WL3. The channel of the memory cell MC5 connected to the word line WL3 is disconnected with the channel of the memory cell MC11 between the memory cell MC8 and a ground selection transistor GST by the turned-off memory cell MC8. That is, the pass voltage Vpass2 represents local boosting. Subsequently, in a section 't3-t4', a memory cell MC4 is programmed. For example, the pass voltage Vpass2 and the program voltage Vpgm have a level that varies with a peripheral temperature.

In the section 't2-t3', a word line WL2 voltage decreases to the pass voltage Vpass2 and the memory cell MC8 is turned off, in a state where the channel voltages of the memory cells MC2, MC5, MC8 and MC11 are boosted by the pass voltage Vpass1. The voltage of the drain region of the memory cell MC8 is a channel voltage that is boosted by the pass voltage Vpass1, and the voltage of the control gate of the memory cell MC8 is the pass voltage Vpass2. Since the voltage of the drain region of the memory cell MC8 is higher than the voltage of the control gate of the memory cell MC8, Gate Induced Drain Leakage (GIDL) may occur in the memory cell MC8. When GIDL occurs in the memory cell MC8, the leakage of electric charges occurs from the channel of the memory cell MC5 to the bulk region of the memory cell array 310. That is, since the channel voltage of the memory cell MC5 decreases, program disturbance may occur Vpgm in the memory cell MC5 by the program voltage.

Moreover, when GIDL occurs in the memory cell MC8, thermal electrons are produced. The thermal electrons may be injected into the electric charge storage layer of the memory cell MC8. That is, program disturbance may occur in the memory cell MC8 by the GIDL.

As an example, as a point when the pass voltage Vpass2 is applied to the word line WL2 is closer to a point when the program voltage Vpgm is applied to the word line WL3, the increment point of the drain voltage of the memory cell MC8 (i.e., boosting by the program voltage Vpgm) is close to the decrement point of the control gate voltage of the memory cell MC8. That is, as the application point of the program voltage Vpgm is closer to the application point of the pass voltage Vpass2, the influence of the GIDL that occurs in the memory cell MC8 may increase. To the contrary, as the difference between the application point of the program voltage Vpgm and the application point of the pass voltage Vpass2 increases, a program time increases.

Furthermore, when the program voltage Vpgm and the pass voltage Vpass increase, a voltage of the boosted channel increases. When the voltage of the boosted channel increases, the influence of the GIDL increases. The level of the program voltage Vpgm and the levels of the pass voltages Vpass1 and Vpass2 vary with a peripheral temperature. That is, the influence of the GIDL may be varied according to a peripheral temperature.

The flash memory device 300 may control the application timing of the program voltage Vpgm and the application timing of the pass voltages Vpass1 and Vpass2 so that the influence of GIDL can be minimized, in consideration of the level of the program voltage Vpgm and the levels of the pass voltages Vpass1 and Vpass2 that vary with a peripheral temperature.

For example, when a peripheral temperature increases, the difference between the application point of the program voltage Vpgm and the application point of the pass voltage Vpass2 may be increased. For example, the timing of applying the program voltage Vpgm may be delayed. Thus, the influence of the GIDL based on a peripheral temperature can be compensated.

When a peripheral temperature decreases, the difference between the application point of the program voltage Vpgm and the application point of the pass voltage Vpass2 may be decreased. For example, the timing of applying the program voltage Vpgm may be advanced. Thus, a program time can be decreased.

In FIG. 18, another embodiment of bias voltages that are applied to the memory cell array 310 in FIG. 16 is illustrated in a program operation. The bias voltages in FIG. 18 are the same as the bias voltages that have been described above with reference to FIG. 17, except for the pass voltages Vpass1 and Vpass2 that are applied to the word line WL2 in the section 't2-t3'.

In the section 't2-t3', the word line WL2 voltage is discharged from the pass voltage Vpass1 to the ground voltage Vss, and increases from the ground voltage Vss to the pass voltage Vpss2. Comparing with an embodiment of FIG. 17 in which the pass voltage Vpass2 is applied to the word line WL2 having the applied pass voltage Vpass2, therefore, it can be understood that a speed, in which the word line WL2 voltage varies from the pass voltage Vpass1 to the pass voltage Vpass2, is fast. The flash memory device 300 controls timing in which the word line WL2 voltage varies from the pass voltage Vpass1 to the ground voltage Vss and varies from the ground voltage Vss to the pass voltage Vpass2. The flash memory device 300 controls timing in which a word line WL3 voltage varies from the pass voltage Vpass1 to the program voltage Vpgm.

That is, the flash memory device 300 controls timing in which voltages are applied to the word lines WL2 and WL3, and thus, it can be understood that the flash memory device 300 can prevent GIDL from occurring in the memory cell MC8 that is turned off for breaking the channel region of the programmed memory cell MC5 and the channel region of the memory cell MC11 between the programmed memory cell MC5 and the ground selection transistor GST.

Figure 19:
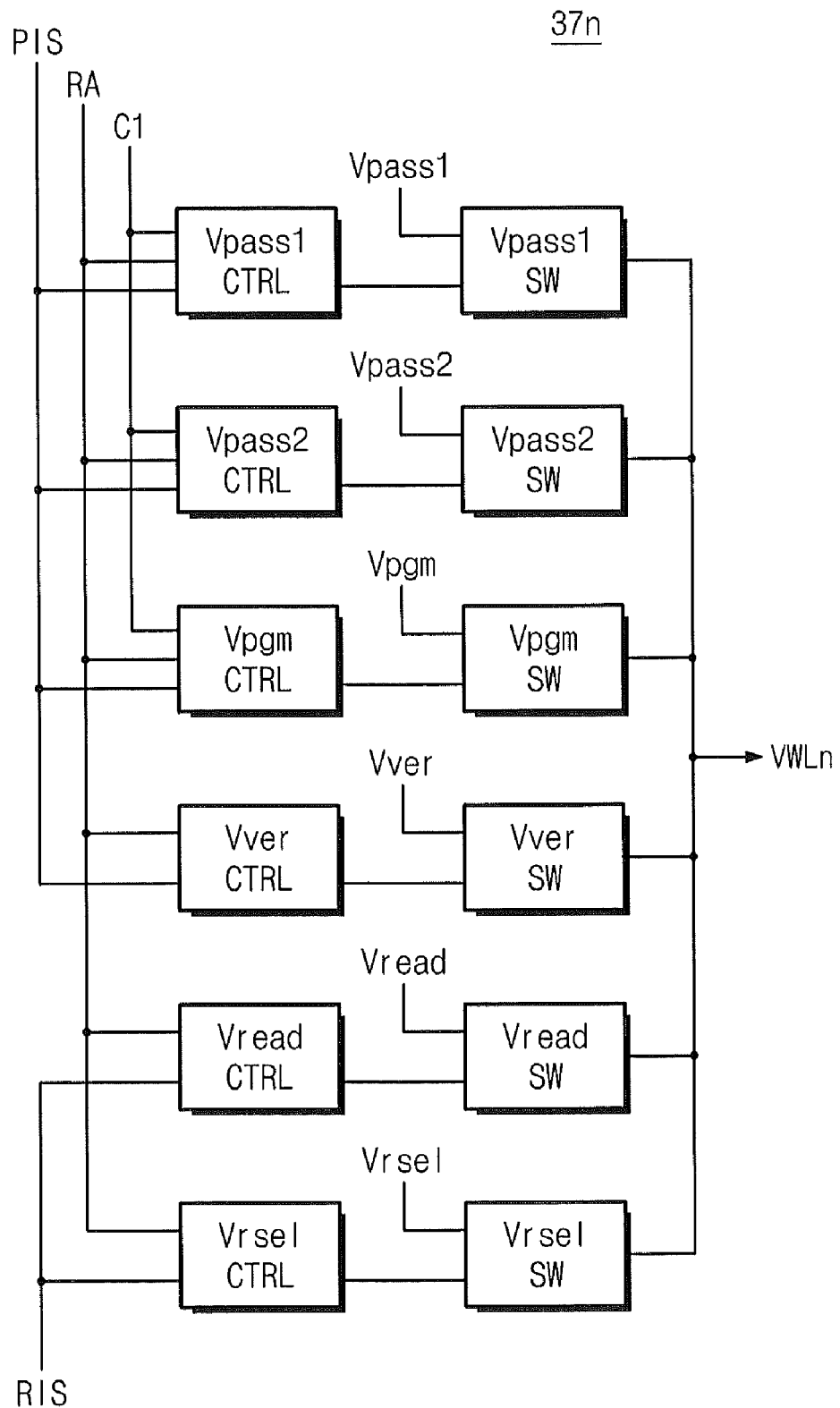
FIG. 19 is a block diagram illustrating a controller in FIG. 15.

FIG. 19 is a block diagram illustrating the controller 37n in FIG. 15.

Referring to FIG. 15, the controller 37n includes a pass voltage controller Vpass1CTRL, a pass voltage switch Vpass1SW, a pass voltage controller Vpass2CTRL, a pass voltage switch Vpass2SW, a program voltage controller VpgmCTRL, a program voltage switch VpgmSW, a verification voltage controller VverCTRL, a verification voltage switch VverSW, a read voltage controller VreadCTRL, a read voltage switch VreadSW, a selection read voltage controller VrselCTRL, and a selection read voltage switch VrselSW.

The pass voltage switch Vpass1SW outputs the pass voltage Vpass1 (which is supplied from the voltage generator 350) as the word line voltage VWLn, in response to the control of the pass voltage controller Vpass1CTRL. The pass voltage switch Vpass2SW outputs the pass voltage Vpass2 (which is supplied from the voltage generator 350) as the word line voltage VWLn, in response to the control of the pass voltage controller Vpass2CTRL. The program voltage switch VpgmSW outputs the program voltage Vpgm (which is supplied from the voltage generator 350) as the word line voltage VWLn, in response to the control of the program voltage controller VpgmCTRL. The verification voltage switch VverSW outputs the verification voltage Vver (which is supplied from the voltage generator 350) as the word line voltage VWLn, in response to the control of the verification voltage controller VverCTRL.

The read voltage switch VreadSW outputs the read voltage Vread (which is supplied from the voltage generator 350) as the word line voltage VWLn, in response to the control of the read voltage controller VreadCTRL. The selection read voltage switch VrselSW outputs the selection read voltage Vrsel (which is supplied from the voltage generator 350) as the word line voltage VWLn, in response to the control of the selection read voltage controller VrselCTRL.

The program interval signal PIS, which is supplied from the control logic 360, is provided to the pass voltage controller Vpass1CTRL, the pass voltage controller Vpass2CTRL, the program voltage controller VpgmCTRL and the verification voltage controller VverCTRL. The program interval signal PIS represents a section in which the pass voltages Vpass1 and Vpass2, the program voltage Vpgm and the verification voltage Vver are applied. That is, the selected voltage of the pass voltages Vpass1 and Vpass2, the program voltage Vpgm and the verification voltage Vver is outputted as the word line voltage VWLn during a predetermined section according to the program interval signal PIS.

For example, the program interval signal PIS may include a plurality of sub-signals. The program interval signal PIS may include a sub-signal for selecting the pass voltage Vpass1, a sub-signal for selecting the pass voltage Vpass2, a sub-signal for selecting the program voltage Vpgm, a sub-signal for selecting the verification voltage Vver, etc. Each sub-signal may indicates am interval for applying a selected voltage.

The read interval signal RIS, which is supplied from the control logic 360, is provided to the read voltage controller VreadCTRL and the selection read voltage controller VrselCTRL. The read interval signal RIS represents a section in which the read voltage Vread and the selection read voltage Vrsel are applied. That is, the selected voltage of the read voltage Vread and the selection read voltage Vrsel is outputted as the word line voltage VWLn during a predetermined section according to the read interval signal RIS.

For example, the read interval signal RIS may include a plurality of sub-signals. The read interval signal RIS may include a sub-signal for selecting the read voltage Vread, the selection read voltage Vrsel, etc. Each sub-signal may indicates an interval for applying a selected voltage.

A row address RA is supplied to the pass voltage controller Vpass1CTRL, the pass voltage controller Vpass2CTRL, the program voltage controller VpgmCTRL, the verification voltage controller VverCTRL, the read voltage controller VreadCTRL and the selection read voltage controller VrselCTRL. In response to the row address RA, the pass voltage controller Vpass1CTRL, the pass voltage controller Vpass2CTRL, the program voltage controller VpgmCTRL, the verification voltage controller VverCTRL, the read voltage controller VreadCTRL and the selection read voltage controller VrselCTRL are activated.

The code C1 (which is provided from the temperature detection circuit of the voltage generator 350 pertaining to the temperature detection circuit 270 in FIGS. 6 and 7) corresponding to a peripheral temperature is provided to the pass voltage controller Vpass1CTRL, the pass voltage controller Vpass2CTRL and the program voltage controller VpgmCTRL. The pass voltage controller Vpass1CTRL, the pass voltage controller Vpass2CTRL and the program voltage controller VpgmCTRL control timing in which the pass voltages Vpass1 and Vpass2 and the program voltage Vpgm are applied, in response to the code C1 representing a peripheral temperature.

For example, when the code C1 indicates that a peripheral temperature increases, the timing of applying the program voltage Vpgm may be delayed. When the code C1 indicates that a peripheral temperature decrease, the timing of applying the program voltage Vpgm may be advanced.

For example, each of the pass voltage controller Vpass1CTRL, the pass voltage controller Vpass2CTRL and the program voltage controller VpgmCTRL may include at least one delay unit. By using the at least one delay unit, the pass voltage controller Vpass1CTRL, the pass voltage controller Vpass2CTRL and the program voltage controller VpgmCTRL control timing in which the pass voltages Vpass1 and Vpass2 and the program voltage Vpgm are applied respectively. It will be understood that the timings of applying the read voltage Vread and the selected read voltage Vrsel also can be controlled.

That is, in the word line controller 370 (see FIG. 15), the pass voltages Vpass1 and Vpass2 and the program voltage Vpgm are outputted as the word line voltages VWL1 to VWLn during a predetermined section according to the program interval signal PIS and output timing is controlled according to the code C1.

In embodiments that have been described above, it has been described above that timing, in which the pass voltages Vpass1 and Vpass2 and the program voltage Vpgm are applied, is controlled according to the code C1 which is supplied to the word line controller 370. However, the code C1 is supplied to the control logic 360. The control logic 360 controls the program interval signal PIS, which is provided to the pass voltage controller Vpass1CTRL, the pass voltage controller Vpass2CTRL and the program voltage controller VpgmCTRL, in response to the code C1, and thus, timing in which the pass voltages Vpass1 and Vpass2 and the program voltage Vpgm are applied may be controlled. In this case, the code C1 is not provided to the word line controller 370. Thus, the word line controller 370 can be simplified.

Timing in which the pass voltages Vpass1 and Vpass2 and the program voltage Vpgm are applied in response to a peripheral temperature may be controlled according to a preset table. As an example, the table is determined through calculation on the change of a temperature and the change of the voltages Vpass1, Vpass2 and Vpgm. As another example, a table is set on the application timing of the voltages Vpass1, Vpass2 and Vpgm based on the change of the temperature.

In embodiments that have been described above, it has been described above that the pass voltage Vpass2 is applied to the word line WL2, which is disposed between the selection word line WL3 and the ground selection ling GSL, adjacent to the selection word line WL3. According to embodiments of the present invention, however, the pass voltage Vpass2 may be applied to at least one word line other than the word line WL2, which is disposed between the selection word line WL3 and the ground selection ling GSL, adjacent to the selection word line WL3.

For example, the pass voltage Vpass2 may be applied to the nth word line in the direction from the selection word line to the ground selection word line. As an example, the pass voltage Vpass2 may be applied to the kth word line in the direction from the selection word line to the string selection line. The pass voltage Vpass2 may be applied in common to the nth word line in the direction from the selection word line to the ground selection word line and the kth word line in the direction from the selection word line to the string selection line.

Moreover, the pass voltages that are applied to the non-selected word lines are not limited to the first and second pass voltages Vpass1 and Vpass2. It can be understood that different pass voltages having different levels may be applied to the non-selected word lines.

Figure 20:
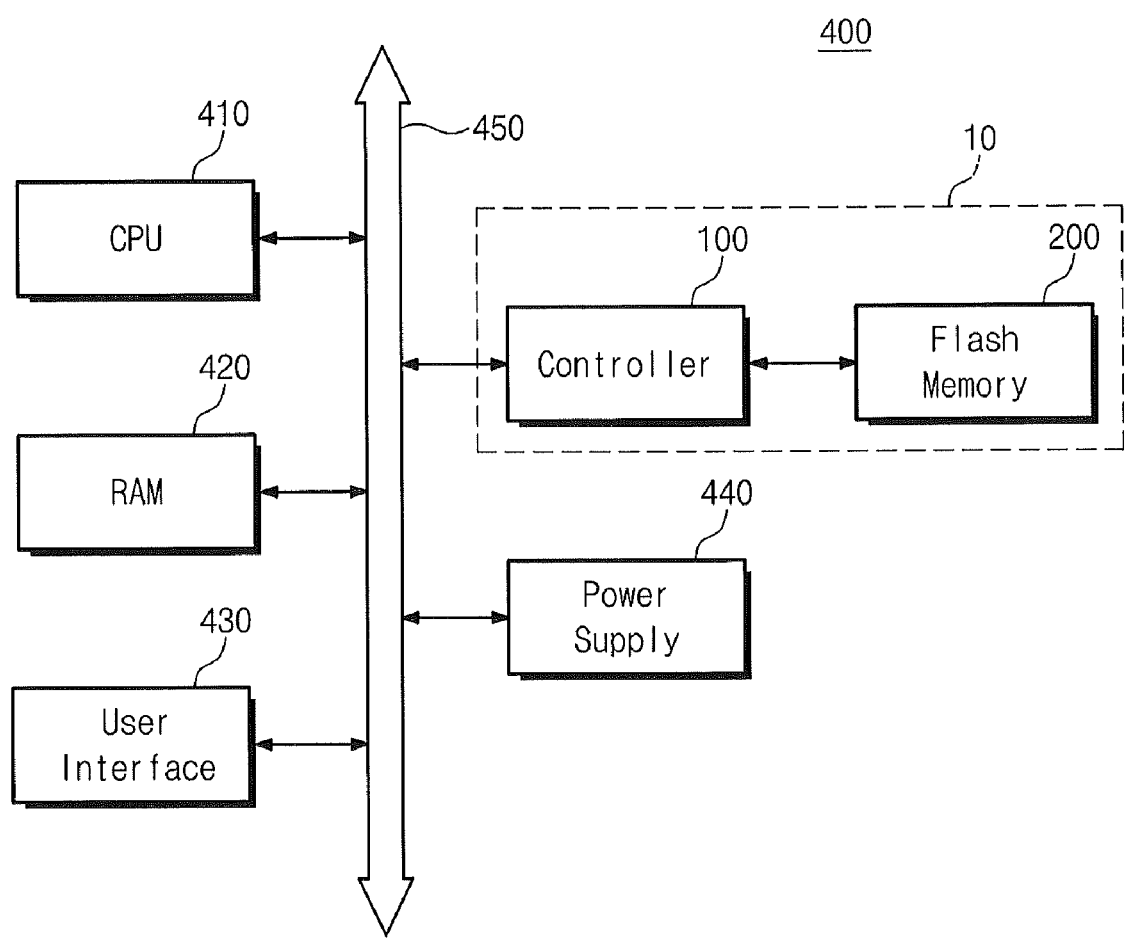
FIG. 20 is a block diagram illustrating an embodiment of a computing system including the memory system in FIG. 1.

FIG. 20 is a block diagram illustrating an embodiment of a computing system 400 including the memory system 10 in FIG. 1.

Referring to FIG. 20, a computing system according to an embodiment of the present invention includes a central processing unit (CPU) 410, a RAM 420, a user interface 430, a power supply source 440, and the memory system 10.

The memory system 10 is electrically connected to the CPU 410, the RAM 420, the user interface 430 and the power supply source 440 through a system bus 450. Data, which are supplied through the user interface 430 or are processed by the CPU 410, are stored in the memory system 10. The memory system 10 includes the controller 100 and the flash memory device 200.

When the memory system 10 is mounted as a semiconductor disk device such as Solid State Drive (SSD), the booting speed of the computing system 400 becomes far faster. Although not shown, the system according to an embodiment of the present invention may further include an application chipset or/and a camera image processor. This is apparent to those skilled in the art.

The flash memory device according to embodiments of the present invention includes the memory cell array that is connected to the plurality of word lines, and the voltage generator that generates the program voltage and the pass voltage which are respectively provided to the selected word line and non-selected word line of the word lines when the program operates, wherein the voltage generator varies the level of the pass voltage with temperature. Accordingly, the flash memory device is provided which operates with change of a peripheral temperature.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device, comprising:
a memory cell array connected to a plurality of word lines;
a voltage generator generating a program voltage which is supplied to a selected word line of the word lines and a pass voltage which is supplied to a non-selected word line of the word lines, in a program operation,
wherein the voltage generator varies a level of the pass voltage with a temperature,
wherein the pass voltage is divided into different first and second pass voltages according to a location of the non-selected word line; and
a control logic controlling timing, in which the first and second pass voltages and the program voltage are applied to the memory cell array, in response to the temperature in the program operation, by varying a difference in time between when the second pass voltage and the program voltage are applied to the memory cell array.

2. The flash memory device of claim 1, wherein the second pass voltage is higher than a ground voltage and lower than the first pass voltage.

3. The flash memory device of claim 1, further comprising a word line controller receiving the first and second pass voltages and the program voltage from the voltage generator,
wherein the word line controller selects any one of the first and second pass voltages and the program voltage to apply the selected voltage to a corresponding word line and controls timing in which the selected voltage is applied, in response to a row address, the temperature and a program interval signal which is transferred from the control logic.

4. The flash memory device of claim 1, wherein the voltage generator comprises:
a temperature detection circuit detecting the temperature;
a voltage control circuit converting the detected temperature into a control signal for varying the pass voltage; and
a voltage generation circuit varying the level of the pass voltage in response to the control signal.

5. The flash memory device of claim 1, wherein:
the voltage generator generates a selection read voltage which is applied to the selected word line in a read operation, a read voltage which is applied to the non-selected word line in the read operation and a verification voltage which is applied in the program operation, and
the voltage generator varies a level of the selection read voltage, a level of the read voltage and a level of the verification voltage with the temperature.

6. The flash memory device of claim 1, wherein when the temperature is higher than a temperature of a previous state, the voltage generator further decreases the level of the pass voltage than a level of the previous state.

7. The flash memory device of claim 1, wherein when the temperature is lower than a temperature of a previous state, the voltage generator further increases the level of the pass voltage than a level of the previous state.

8. The flash memory device of claim 1, wherein the control logic controls the timing by varying a difference in time between when each of the first pass voltage, the second pass voltage, and the program voltage are applied to the memory cell array, in response to the temperature in the program operation.

9. The flash memory device of claim 1, wherein the timing is controlled according to values of the first pass voltage, the second pass voltage, and the program voltage in a table.

10. A memory system, comprising:
a flash memory device;
a controller controlling the flash memory device,
wherein the flash memory device comprises:
a memory cell array connected to a plurality of word lines; and
a voltage generator generating a program voltage which is supplied to a selected word line of the word lines and a pass voltage which is supplied to a non-selected word line of the word lines, in a program operation,
wherein the voltage generator varies a level of the pass voltage with a temperature,
wherein the pass voltage is divided into different first and second pass voltages according to a location of the non-selected word line; and
a control logic controlling timing, in which the first and second pass voltages and the program voltage are applied to the memory cell array, in response to the temperature in the program operation, by varying a difference in time between when the second pass voltage and the program voltage are applied to the memory cell array.

* * * * *